(12) United States Patent
Inagawa et al.

(10) Patent No.: US 6,455,378 B1
(45) Date of Patent: Sep. 24, 2002

(54) METHOD OF MANUFACTURING A TRENCH GATE POWER TRANSISTOR WITH A THICK BOTTOM INSULATOR

(75) Inventors: Hiroshi Inagawa, Maebashi (JP); Nobuo Machida, Takasaki (JP); Kentaro Oishi, Takasaki (JP)

(73) Assignees: Hitachi, Ltd., Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 0 days.

(21) Appl. No.: 09/695,036

(22) Filed: Oct. 25, 2000

(30) Foreign Application Priority Data

Oct. 26, 1999 (JP) ............................ 11-303416
Oct. 26, 1999 (JP) ............................ 11-303680

(51) Int. Cl.$^7$ ............................................ H01L 21/336
(52) U.S. Cl. ..................... 438/270; 438/589; 438/981
(58) Field of Search ................................. 438/138, 268, 438/270, 424, 430, 589, 981

(56) References Cited

U.S. PATENT DOCUMENTS

| 4,992,390 A | * 2/1991 | Chang ...................... 438/270 |
| 5,473,176 A | * 12/1995 | Kakumoto .................. 438/270 |
| 6,198,127 B1 | * 3/2001 | Kocon ...................... 257/328 |

FOREIGN PATENT DOCUMENTS

JP       1-192174       8/1989

* cited by examiner

*Primary Examiner*—Chandra Chaudhari
(74) *Attorney, Agent, or Firm*—Mattingly, Stanger & Malur

(57) ABSTRACT

There are formed a gate insulator 8 and a gate 3 of a power transistor Q having a trench-gate structure. There are then formed a channel region 5 and a source region 6 of the power transistor Q.

10 Claims, 31 Drawing Sheets

|  | $Q_M$ | $Q_A$ | $Q_B$ |
|---|---|---|---|
| $I_1$ | ON | ON | OFF |
| $I_2$ | OFF | OFF | ON |

METHOD OF MANUFACTURING A TRENCH GATE POWER TRANSISTOR WITH A THICK BOTTOM INSULATOR

TECHNICAL FIELD OF THE INVENTION

The present invention relates to a semiconductor device manufacturing method and a semiconductor device. Particularly, the present invention relates to a technology that is effectively applicable to a semiconductor device having a trench-gate structured power field-effect transistor (hereafter simply referred to as the trench power transistor).

BACKGROUND OF THE INVENTION

The inventors have examined the following manufacturing technology for trench power transistor. On a principal plane of a semiconductor substrate, there is formed a trench extending in a direction which crosses the principal plane. A gate oxidation treatment is then applied to the semiconductor substrate to form a gate oxidation film on an inner wall face (bottom and side surfaces) of the trench. Subsequently, say a polycrystal silicon film is deposited on the principal plane of the semiconductor substrate by preventing the polycrystal silicon film from filling the trench. Then, a gate electrode is formed by etching back the polycrystal silicon film so that the polycrystal silicon film remains in the trench.

Generally, thinning a gate insulator improves the power field-effect transistor's drive capability. However, excessively thinning the gate insulator of the trench power transistor also thins the film thickness at the bottom, failing to ensure a pressure resistance. Doing so also increases a capacity between a gate and a drain, thus increasing a switching loss for the trench power transistor. Accordingly, the above-mentioned technology needs to relatively thicken the gate insulator all over the inner wall face of a trench so that these problems should not occur. This also causes a problem of impeding improvement of the trench power transistor's drive capability. For example, Japanese Patent Laid-Open Publication No. 1-192174 documents the technology for preventing a decrease in the gate pressure resistance at the trench bottom of a trench power transistor. The publication discloses the structure in which the insulator thickness at the trench bottom is thicker than that on the trench's side face.

SUMMARY OF THE INVENTION

However, the inventors found the following problems in the technology disclosed in the above-mentioned publication.

According to the technology disclosed in the abovementioned publication, a source-drain region of a trench power transistor is formed on a semiconductor substrate. Then, the semiconductor substrate is trenched and processed with the gate oxidation treatment. Therefore, there is a problem that impurities in the source-drain drain region may diffuse during heat treatment or the like to follow using the silicon nitride film as an oxidation-resistant mask. It is difficult to form a shallow junction in the source region. As it is difficult to set and control a channel length for the trench power transistor, there arises a problem of degrading the trench power transistor performance.

A general object of the present invention is to provide a technology which can decrease a capacity between the gate and drain in the trench power transistor.

It is a more specific object of the present invention to provide a technology which can improve the trench power transistor's drive capability.

It is another object of the present invention to provide a technology which can improve the gate insulation pressure resistance of the trench power transistor.

It is still another object of the present invention to provide a technology which can form a shallow junction for the source region in the trench power transistor.

It is a further object of the present invention to provide a technology which can improve controllability of the source region and the channel region in the trench power transistor.

It is a still further object of the present invention to provide a technology which can improve the trench power transistor performance.

Other objects and new features of the present invention will become apparent from the detailed description in this specification to follow taken in conjunction with the accompanying drawings.

The present invention disclosed in this specification is broadly summarized as follows.

That is, according to the present invention, a gate insulator is formed in a trench on a semiconductor substrate so that the trench bottom becomes relatively thicker than the trench's side face. Then, a gate is formed in the trench. Further, the semiconductor substrate is provided with impurities for forming a semiconductor region of the field-effect transistor.

During a manufacturing process of the semiconductor substrate, the present invention has a step of forming an epitaxial layer containing second impurities on the surface of the semiconductor base substance containing first impurities so that the density of the second impurities becomes smaller than that of the first impurities.

According to the present invention, an impurity density for the gate is greater than impurity densities for the channel region and a source region.

The present invention has a step of forming a first insulator on a principal plane of the semiconductor substrate, then removing a region where the trench is formed from the first insulator to form an opening, and then planing the semiconductor substrate exposed from the opening by using the first insulator as a mask to form the trench.

The present invention has a step of rounding corners of the trench bottom.

The present invention has a step of making the first insulator's opening larger than the trench size after the step of forming the trench and before the step of forming the gate insulator.

In the present invention,
the step of forming the gate insulator comprises the steps of:
forming a second insulator on an inner face of the trench;
forming an oxidation-resistant third insulator on the second insulator surface;
etching back the third insulator to leave it on the trench side face;
applying oxidation treatment to the semiconductor substrate to selectively form a relatively thick insulator on a region exposed from the third insulator on the semiconductor substrate;
removing the third insulator, then removing the second insulator; and
applying oxidation treatment to the semiconductor substrate after removing the second insulator to form a gate insulator which provides a greater thickness on the principal plane of the semiconductor substrate exposed from the opening in the first insulator and the trench bottom than on the trench side face.

The step of forming the gate further comprises of the steps of:

depositing a conductor film in the trench and on the principal plane of the semiconductor substrate; and etching back the conductor film to form the gate whose cross section is T-shaped.

After the oxidation treatment is used to form a gate insulator, the present invention has a step of depositing an insulator through the use of chemical vapor growth on the surface of the gate insulator.

According to the present invention, a gate insulator is formed in a trench on the semiconductor substrate so that a trench bottom and a trench shoulder become thicker than a trench side face. A gate is formed so that it is embedded in the trench and is extended on the semiconductor substrate's principal plane. A field-effect transistor's semiconductor region is formed on the semiconductor substrate.

BRIEF DESCRIPTIONS OF THE DRAWINGS

DESCRIPTION OF THE PREFERRED EMBODIMENTS

Embodiments of the present invention will be described in further detail with reference to the accompanying drawings. In all drawings for explaining the embodiments, the same function is assigned the same numeral for omitting repetitive explanations.

[First Embodiment]

Figure 1:
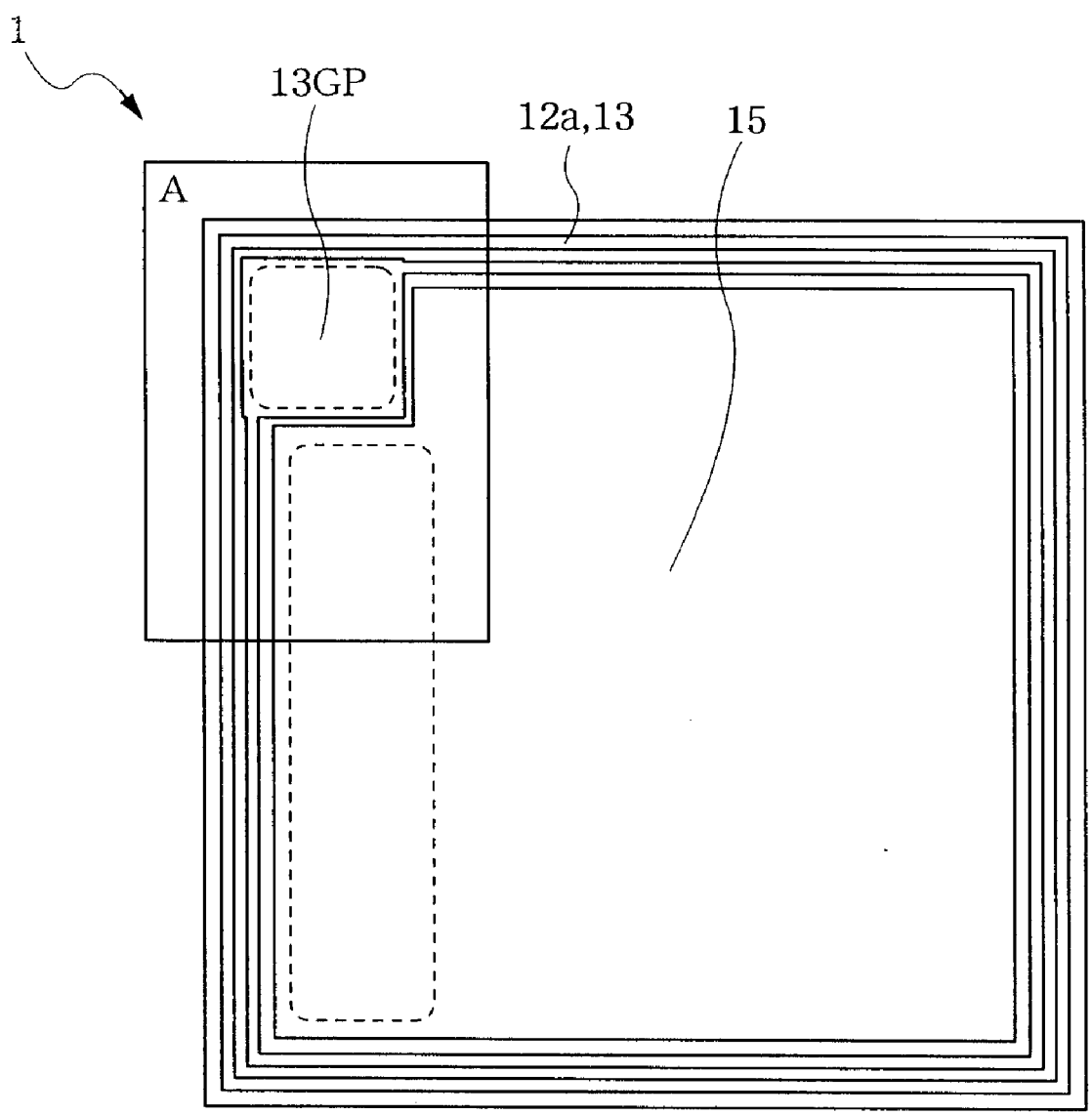
FIG. 1 is a plan view of a semiconductor chip constituting a semiconductor device as an embodiment of the present invention.
Figure 2:
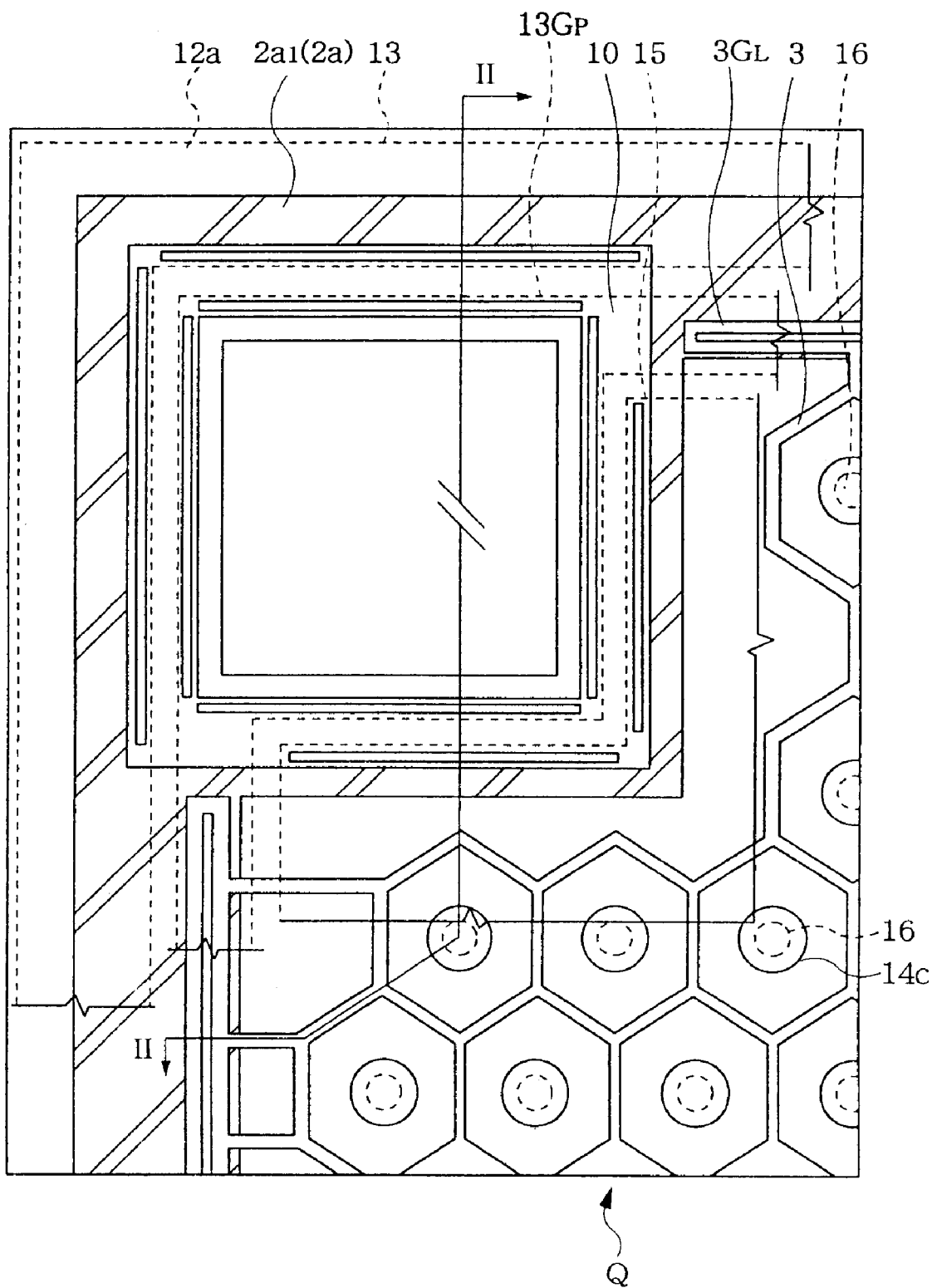
FIG. 2 is an enlarged plan view of an area A in FIG. 1.
Figure 3:
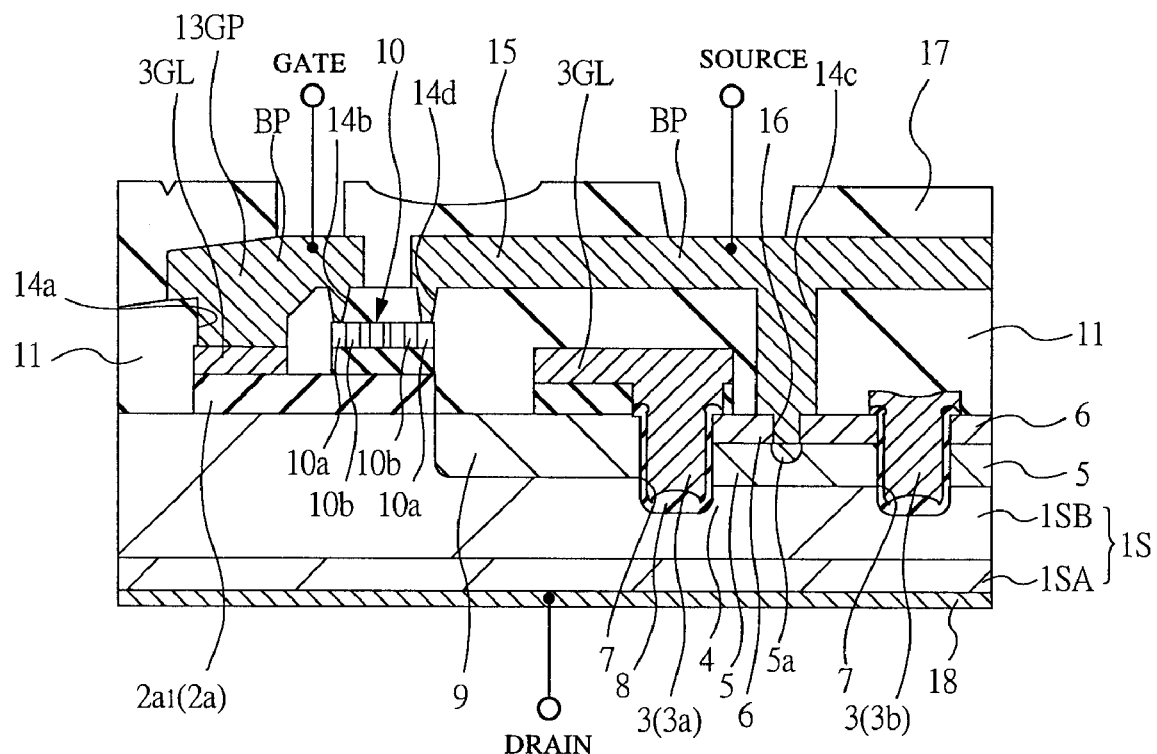
FIG. 3 is a partially sectional view taken in the line B—B of FIG. 2.
Figure 4:
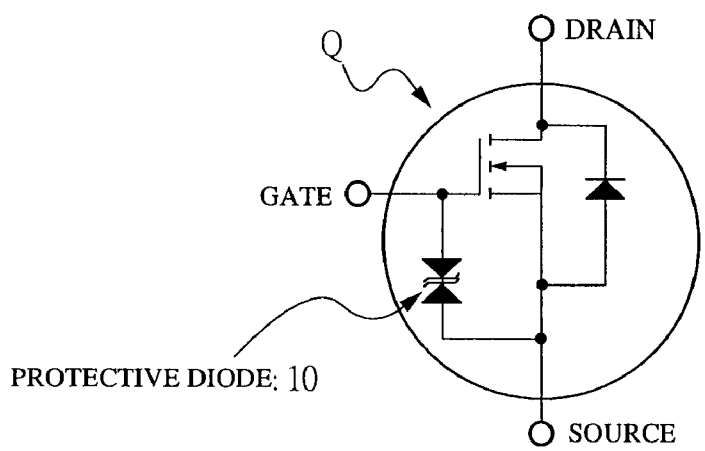
FIG. 4 is a circuit diagram showing a trench power transistor and an accompanying protective diode.

FIG. 1 is a plan view of a semiconductor chip 1 constituting a trench power transistor as the first embodiment of the present invention. FIG. 2 is an enlarged plan view of an area A in FIG. 1. FIG. 3 is a partially sectional view taken in the line B—B of FIG. 2. FIG. 4 is a circuit diagram showing a trench power transistor and an accompanying protective diode.

A semiconductor chip 1 has a semiconductor substrate 1S formed, for example, in a plane rectangular shape. The semiconductor substrate 1S comprises a semiconductor base substance 1SA and an epitaxial layer 1SB formed thereon. The semiconductor base substance 1SA comprises, for example, an $n^+$-type silicon single crystal. The epitaxial layer 1SB comprises an $n^-$-type silicon single crystal formed by, for example, the epitaxial growth. The epitaxial layer 1SB ensures pressure resistance between a source and a drain, and has a resistance value of, for example, approximately 0.25 through 0.36 mΩcm and a thickness of, for example, approximately 5 μm. On the epitaxial layer 1SB, there is formed a thick insulator 2a comprising, for example, a thick silicon oxide film near an outer periphery of a principal plane (face where a semiconductor element is formed) on the semiconductor substrate 1S. The insulator 2a is extended along this outer periphery and is formed in a planar annulation. Near an edge of the semiconductor substrate 1S on part of the insulator 2a, a wide portion 2a1 is formed, for example, in a plane rectangular shape and is integrated with the insulator 2a.

A plurality of vertical trench power transistors Q are placed in an element region surrounded by this thick insulator 2a. Each trench power transistor Q is arranged regularly and has, for example, a plane hexagonal shape or a flat octagonal shape. The trench power transistor Q employs an MISFET (Metal Insulator Semiconductor Field Effect Transistor) structure comprising a gate 3 (3a, 3b), a drain region 4, a channel region 5 thereon, a source region 6 thereon, a trench 7, and a gate insulator 8.

The gate 3 (3a, 3b) comprises, for example, $n^+$-type low-resistance polysilicon containing phosphorus and has an impurity density of, for example, approximately $3.5 \pm 1.5 \times 10^2/cm^3$. That is, the impurity density for the gate 3 is at least, for example, $2.0 \times 10^{20}/cm^3$. In plan view, the gate 3 is meshed, for example. Each trench power transistor Q is connected parallel to each other, forming a mesh gate structure. In the first embodiment, a sectional view of the gate 3 (3a, 3b) is T-shaped, for example. A gate portion perpendicular to a principal plane of the semiconductor substrate 1S is embedded in the trench 7 in the semiconductor substrate 1S separated by the gate insulator 8 (trench-gate structure). A gate portion parallel to the principal plane of the semiconductor substrate 1S is formed on this principal plane separated by the gate insulator 8. The gate 3 with a T-shaped section view can provide a shallow junction for the source region 6 compared to a gate with an I-shaped section view. It is possible to provide the trench power transistor Q with a short channel, improving the trench power transistor Q performance. When an I-shaped gate is processed, its upper face may become lower than the principal plane of the semiconductor substrate 1S. The gate 3 may slip out of the source region 4. This is called a source offset. To prevent this, it is necessary to form a relatively deep junction for the source region 6 on the principal plane of the semiconductor substrate 1S, making it difficult to form a shallow junction. The gate 3 with a T-shaped section view solves this problem because the top face of the gate 3 is always positioned above the principal plane of the semiconductor substrate 1S. Even though the gate 3b slightly sinks at its top face center, the cavity does not reach the trench 7, thus preventing the above-mentioned problem. Accordingly, the source region 6 can provide a shallow junction. Providing the source region 6 with shallow junctions can improve the transistor performance for the following reason. The channel region 5 of the trench power transistor Q is formed on the side face of the gate 3. It is necessary to form the channel region 5 so that it can fully controlled. Like other devices, a short channel is required for improving performance of the trench power transistor Q. The channel length depends on the implantation depth and density of impurity ions. The shallower the source region becomes, the more easily these factors can be controlled. Providing the trench power transistor with high performance requires a source region with shallow junctions. The gate 3 is electrically connected to a gate line 3GL near the outer periphery of the semiconductor chip 1. The same material is used for the gate line 3GL and the gate 3 which are integrated to each other. The gate line 3GL is formed on thick insulators 2a and 2b on the principal plane of the semiconductor substrate 1S.

The drain region 4 is formed at an epitaxial layer 1SB near the bottom of the gate 3. Namely, the drain region 4 comprises an $n^-$-type semiconductor region. The trench 7 is so deeply formed that its bottom and vicinity reach the drain region 4. The channel region 5 is formed on the drain region 4 and to the side face of the gate 3, and is set to p-type by implanting, for example, boron. An impurity density for the channel region 5 is at most, for example, approximately $1.0 \times 10^{17}/cm^3$, namely, over thousandths thinner than the impurity density for the gate 3. The source region 6 is formed on the channel region 5 and to the side face of the gate 3, and is set to n$^+$-type by implanting, for example, arsenic. According to the first embodiment, the semiconductor device manufacturing method of the present invention to be described below causes minimal errors in setting ranges of the channel region 5 and the source region 6, and provides the source region 6 with shallow junctions.

In the first embodiment, the gate insulator 8 in the trench 7 is formed with uneven thickness. The gate insulators 8 at the trench 7 bottom, namely on the drain region 4 side and near the trench 7 opening are thicker than the gate insulator 8 on the channel region 5 side. Thinning the gate insulator 8 on the channel region 5 side can improve a drive capability of the trench power transistor Q. Thickening the gate insulator 8 on the drain region 4 side decreases a capacity between the gate and the drain, providing high-speed switching. The gate 3 with a T-shaped section view can prevent a source offset as mentioned above and provides the source region 6 with shallow junctions. This effectively ensures the yield and reliability, but increases a capacity between the gate and the semiconductor substrate due to the T-shaped structure. In the first embodiment, partially thickening the gate insulator 8 decreases this capacity, allowing high-speed switching. However, merely thickening the gate insulator 8 degrades mutual conductance, increases ON-resistance (resistance between the source and the drain), or decreases a production margin due to a decreased punch-through margin, for example. By thickening the gate insulator 8 particularly at the trench 7's bottom, the first embodiment can decrease the above-mentioned capacity and allow high-speed switching without increasing ON-resistance or decreasing a production margin. Thickening the gate insulator 8 at the trench 7 opening relieves the electric field concentration, thus improving the gate insulation pressure resistance. In the first embodiment, the gate insulator 8 comprises, for example, a thermal oxidation film with the thickness of approximately 24 through 30 nm and a CVD (Chemical Vapor Deposition) film deposited thereon with the thickness of approximately 55 through 65 nm. Depositing the CVD film in this way improves the gate insulator 8's coverage at trench 7's bottom corners and ensures the gate insulator 8's pressure resistance. A p-well 9 is formed on the epitaxial layer 1SB of the semiconductor substrate 1S. The p-well 9 is implanted with, for example, boron and decreases an electric field applied to the end of the gate 3. A back-to-back structured protective diode 10 is provided on the wide portion 2a of the thick insulator 2. For example, the protective diode 10 comprises the n$^+$-type semiconductor region 10a and the p-type semiconductor region 10b which are formed alternately and concentrically. As shown in FIG. 4, the protective diode 10 is connected between the gate and the source of the trench power transistor Q and protects the gate insulator 8 against a surge from the source to the gate.

An inter-layer insulator 11 comprising, for example, a silicon oxide film is deposited on the principal plane of the semiconductor substrate 1S. The inter-layer insulator 11 covers the gate 3, the gate line 3GL, and the protective diode 10. A source guard ring is formed in a planar annulation along the outer periphery of the semiconductor substrate 1S's principal plane. The source guard ring comprises an n$^+$-type semiconductor region formed on the semiconductor substrate 1S and a line 12a electrically connected to this region through a contact hole in the inter-layer insulator 11. The line 12a is formed on the inter-layer insulator 11 and is electrically connected to an n$^+$-type semiconductor region 10a of the protective diode 10 through a contract hole in the inter-layer insulator 11. A gate guard ring 13 is formed in a planar annulation inside and along the source guard ring. A gate electrode 13GP, for example, in a plane rectangular shape is formed integrally to part of the gate guard ring 13. The gate electrode 13GP is formed on the wide portion 2a1 near one corner of the semiconductor chip 1. The gate guard ring 13 and the gate electrode 13GP are electrically connected to the gate line 3GL through a contact hole 14a and the like in the inter-layer insulator 11. The gate guard ring 13 and the gate electrode 13GP are electrically connected to the n$^+$-type semiconductor region 10a of the protective diode 10 through a contact hole 14b in the inter-layer insulator 11. A source line 15 is arranged on the inter-layer insulator 11 inside the gate guard ring 13. The source line 15 is electrically connected to the source region 6 through a contact hole 14c in the inter-layer insulator 11. The source line 15 is also electrically connected to a p$^+$-type semiconductor region 5a of the channel region 5 through a hole 16 for grounding the channel and the source. The hole 16 is dug from the contact hole 14c's bottom along the thickness of the semiconductor substrate 1S. Further, the source line 15 is electrically connected to the n$^+$-type semiconductor region 10a of the protective diode 10 through a contact hole 14d in the inter-layer insulator 11.

The line 12a, the gate guard ring 13, the gate electrode 13GP, and the source line 15 are made of, for example, aluminum, an aluminum-silicon alloy, or an aluminum-silicon-copper alloy. The gate line 3GL and the gate guard ring 13 are provided on the thick insulator 2a. The gate electrode 13GP is provided on the wide portion 2a1.

A surface protection film 17 is deposited on the semiconductor substrate 1S's principal plane. The surface protection film 17 covers the line 12a of the source guard ring, the gate guard ring 13, the gate electrode 13GP, and the source line 15. The surface protection film 17 comprises, for example, a silicon oxide film and a polyimide resin deposited thereon. The silicon oxide film of the surface protection film 17 is formed by means of the plasma CVD method using, for example, TEOS (Tetraethoxysilane) as a source gas. The surface protection film 17 is provided with holes which partially expose the gate electrode 13GP and the source line 15 for forming a bonding pad BP for the gate and the source. The bonding pad BP is connected with, for example, a bonding wire, through which the bonding pad BP and a package lead (for example, an inner lead of a lead frame) and the like are electrically connected. A drain electrode 18 is formed on the rear of the semiconductor chip 1. The drain electrode 18 is formed by layering, for example, nickel, titanium, nickel, and gold in this order. The drain electrode 18 is mounted on a chip packaging area (for example, a die pad of a lead frame) of a package by using conductive adhesive and is electrically connected.

Figures 5A, 5B:
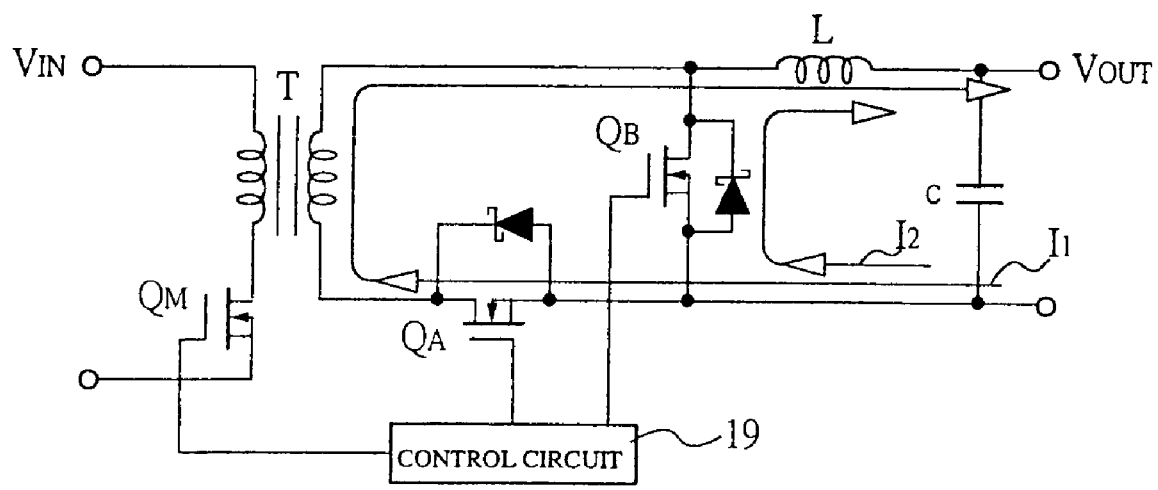
FIG. 5(a) is a circuit diagram of a DC-DC converter using the technical principle of the present invention and FIG. 5(b) is an explanatory drawing illustrating switch operations of each trench power transistor constituting the DC-DC converter.

FIG. 5 shows an example in which the above-mentioned trench power transistor is applied to, for example, a DC-DC converter. FIG. 5(a) is a circuit diagram of the DC-DC converter. FIG. 5(b) is an explanatory drawing illustrating switch operations of each trench power transistor constituting the DC-DC converter. Examples of measurement conditions include: an input voltage of approximately 48 V; an operating frequency of approximately 220 kHz; a gate-source voltage of approximately 7.5 V; and a duty ratio of approximately 0.3. The trench power transistor constitutes a power MISFET $Q_M$ for a main switch and powers MISFET $Q_A$ and MISFET $Q_B$ for switches. A control circuit 19 controls switching operations of MISFET $Q_M$, MISFET $Q_A$, and MISFET $Q_B$. FIG. 5(a) presents a step-down transformer (T), a coil (L), and a capacitor (C).

The transformer T steps down the input voltage applied to an input terminal VIN to, for example, approximately 7.5 V. At this time, the power MISFET $Q_M$ for the main switch is turned on. When the power MISFET $Q_M$ is turned on, the power MISFET $Q_A$ at the forward side and the power MISFET $Q_B$ at the flywheel side are also turned on. A current passes a current path I1 to an output terminal $V_{OUT}$. At this time, a power is accumulated in the coil L and the capacitor C. Turning off the power MISFET $Q_M$ also turns off the power MISFET $Q_A$ to disconnect the current path I1. At this time, the power MISFET $Q_B$ is turned on. A reverse power generated by the coil L lets a current flow through the current path I2. The capacitor C smoothes an output voltage. These components make it possible to generate a stable voltage of approximately 2 V. Normally, the control circuit 19 senses a voltage from the output terminal $V_{OUT}$. When an output increases or decreases, the control circuit 19 maintains a specified voltage by varying a duty ratio between the power MISFET $Q_A$ and the power MISFET $Q_B$.

The following describes a manufacturing method of the semiconductor device according to the first embodiment with reference to FIGS. 6 through 22. In each of FIGS. 8 through 16, (b) is an enlarged sectional view of a gate trench of the trench power transistor in (a).

Figure 6:
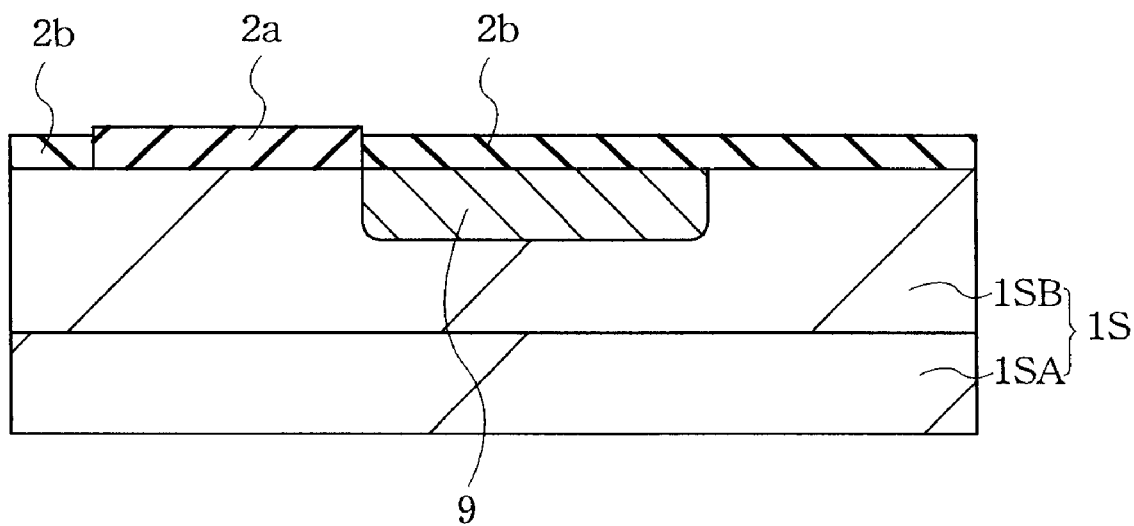
FIG. 6 is a detailed sectional view of the semiconductor device in FIGS. 1 through 3 during a manufacturing process.

As shown in FIG. 6, the semiconductor base substance 1SA comprises an n$^+$-type silicon single crystal implanted with, for example, arsenic. At this stage, the semiconductor base substance 1SA is an almost circular semiconductor wafer. On the semiconductor base substance 1SA's principal plane, the epitaxial method is used to develop the epitaxial layer 1SB comprising an n$^-$-type silicon single crystal with the thickness of, for example, approximately 5 μm. Consequently, the semiconductor substrate 1S (so-called an epitaxial wafer) is manufactured. Then, oxidation treatment is applied to the semiconductor substrate 1S's surface to form the thick insulator 2a with the thickness of, for example 540 through 660 nm. The photolithography and dry etching technologies are used to pattern the thick insulator 2a. The LOCOS (Local Oxidization of Silicon) method can be used for forming the thick insulator 2a. A photo resist film is applied to the semiconductor substrate 1S's principal plane. An exposure process is then performed to pattern the photo resist film so that a well formation region is exposed and the other regions are covered. The photo resist film pattern is used as a mask to implant, for example, boron in the semiconductor substrate 1S's principal plane, and then the photo resist film pattern is removed. A thermal diffusion process is applied to the semiconductor substrate 1S to form the p-well 9. Then, the thermal oxidation treatment is performed for the semiconductor substrate 1S to form a thick insulator 2b with the thickness of, for example, 540 through 660 nm on the semiconductor substrate 1S's principal plane.

Figure 7:
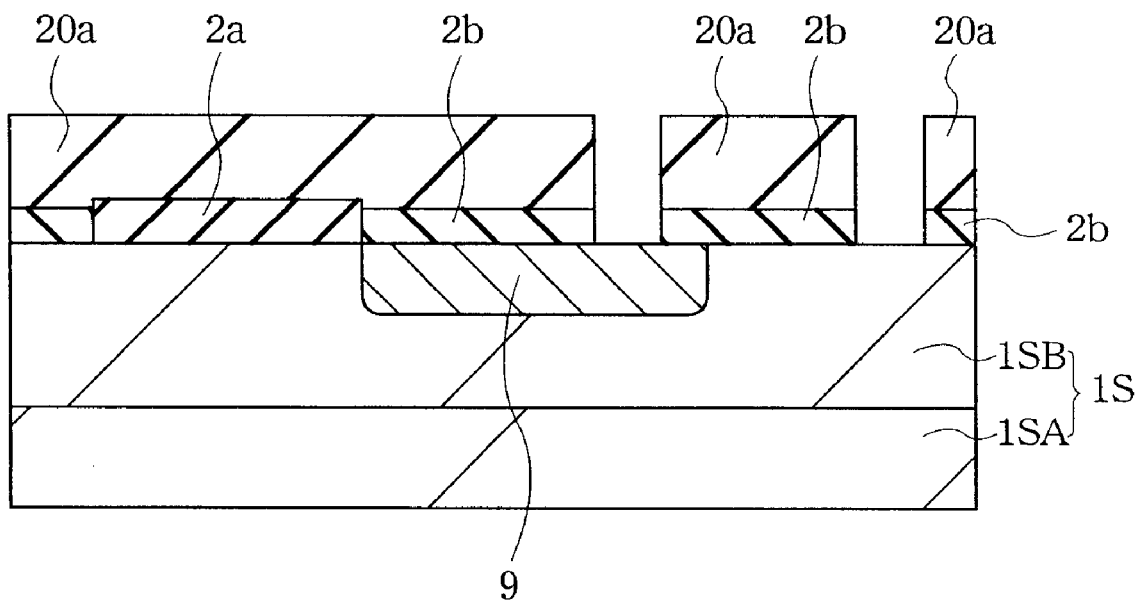
FIG. 7 is a detailed sectional view of the semiconductor device during a manufacturing process following FIG. 6.
Figure 8A:
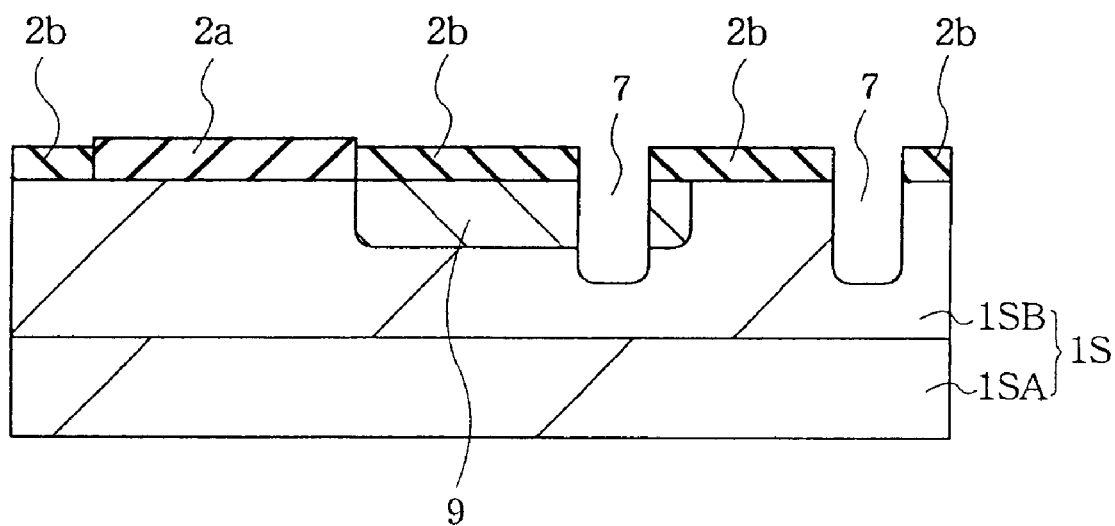
FIG. 8(a) is a detailed sectional view of the semiconductor device during a manufacturing process following FIG. 7
Figure 8B:
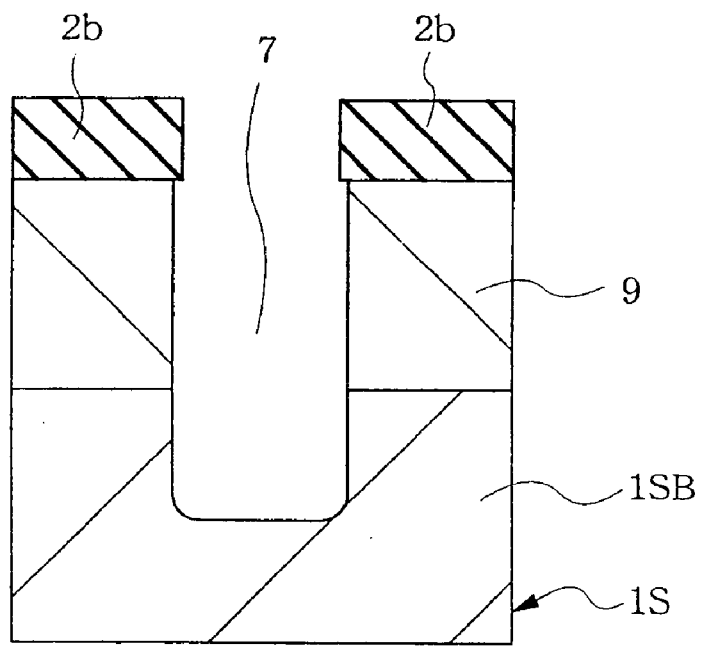
FIG. 8(b) is an enlarged sectional view of the trench in FIG. 8(a)

As shown in FIG. 7, a photo resist is applied to thick insulators 2a and 2b. An exposure process is then performed to pattern these insulators. Thus, the photo resist film 20a is patterned so that a region for gate formation trenches is exposed and the other regions are covered. The photo resist film 20a is used as an etching mask to etch and remove the exposed thick insulator 20b. The photo resist film 20a is then removed. The thick insulators 2a and 2b are left on the semiconductor substrate 1S's principal plane and are used as an etching mask. The dry etching method is used to etch and remove the exposed semiconductor substrate 1S. The trench 7 is thus formed as shown in FIGS. 8(a) and 8(b). The silicon isotropic etching is applied to the semiconductor substrate 1S to smooth bottom corners of the trench 7. This decreases or prevents an electric field from concentrating near bottom corners of the trench 7. The trench 7 width is slightly larger than the opening width of the thick insulator 2b. The trench 7 is deeper than the p-well 9 and is shallower than the bottom of the epitaxial layer 1SB. For example, the trench 7's depth is approximately 1.4 μm.

Figure 9A:
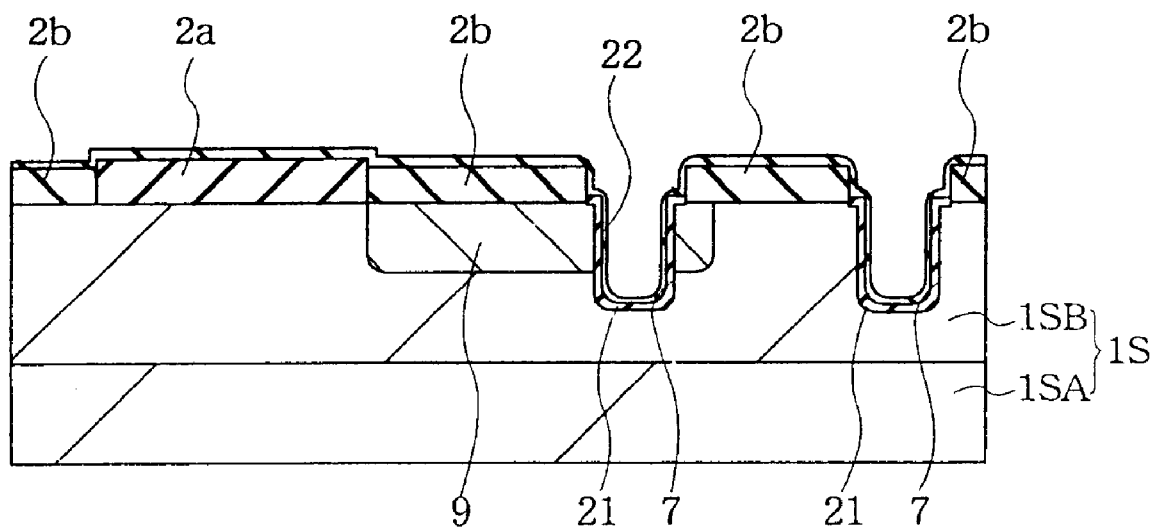
FIG. 9(a) is a detailed sectional view of the semiconductor device during a manufacturing process following FIG. 8
Figure 9B:
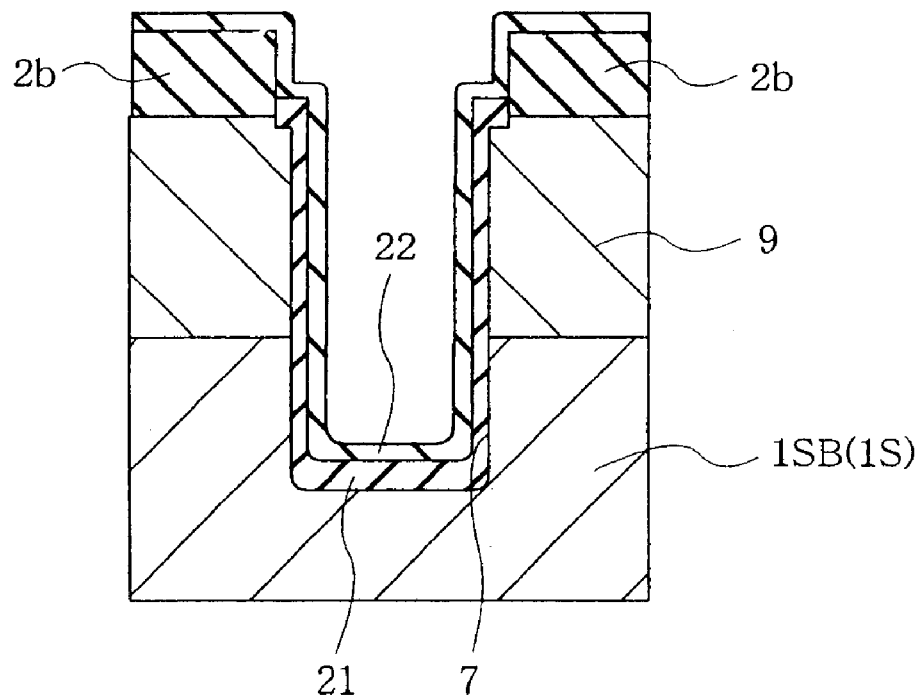
FIG. 9(b) is an enlarged sectional view of the trench in FIG. 9(a)
Figure 10A:
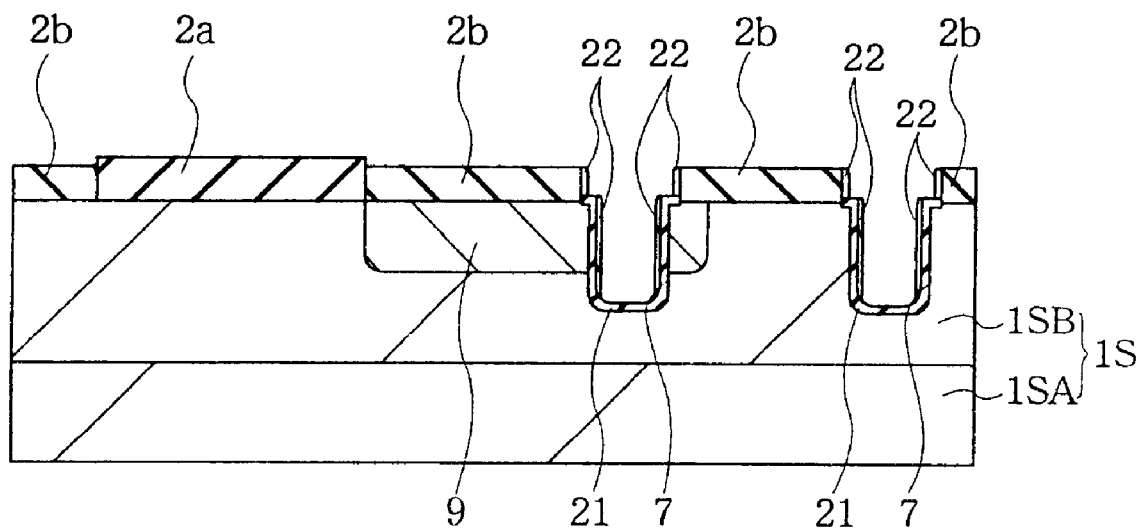
FIG. 10(a) is a detailed sectional view of the semiconductor device during a manufacturing process following FIG. 9
Figure 10B:
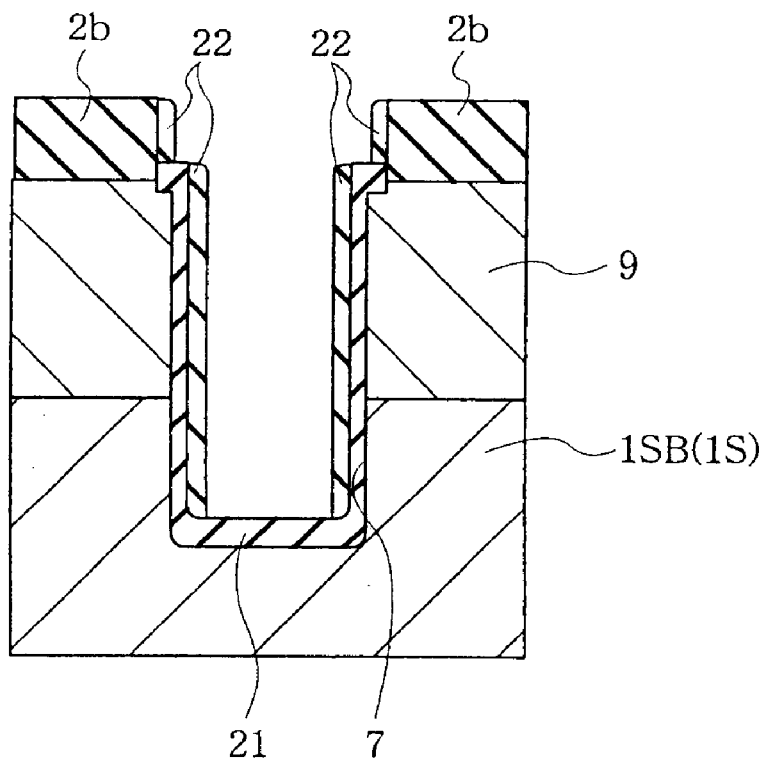
FIG. 10(b) is an enlarged sectional view of the trench in FIG. 10(a)

Then, the semiconductor substrate 1S is cleaned. At this time, the thick insulators 2a and 2b are partially removed. Consequently, as shown in FIGS. 9(a) and 9(b), the thick insulator 2b's opening becomes wider than the trench 7. The thermal oxidation treatment is applied to the semiconductor substrate 1S to form the insulator 21 on the trench 7's inner wall face (side face and bottom) and the semiconductor substrate 1S's principal plane exposed from the thick insulator 2b's opening. For example, the insulator 21's thickness is approximately 1000 Å. Then, the CVD method is used to deposit an oxidation-resistant insulator 22 is formed on the semiconductor substrate 1S's principal plane. The oxidation-resistant insulator 22 comprises, for example, a silicon nitride film with the thickness of approximately 500 Å. The oxidation-resistant insulator 22 is etched back by means of the anisotropic dry etching method by using, for example, chlorine gas and oxygen gas. As shown in FIGS. 10(a) and 10(b), the oxidation-resistant insulator 22 is left only in the trench 7 and on the opening side face of the thick insulator 2b. The insulator 21 is exposed from the trench 7's bottom and shoulder.

Figure 11A:
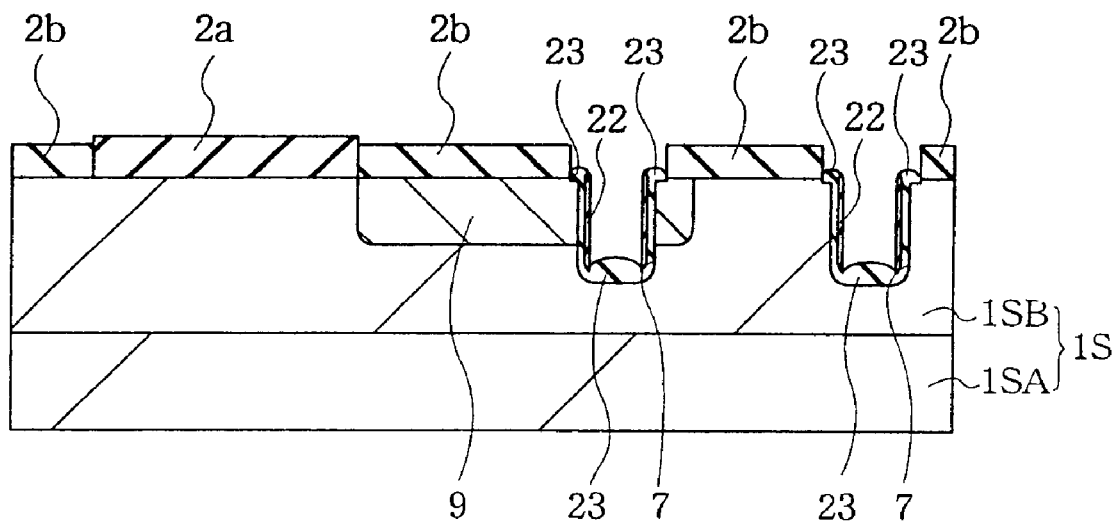
FIG. 11(a) is a detailed sectional view of the semiconductor device during a manufacturing process following FIG. 10
Figure 11B:
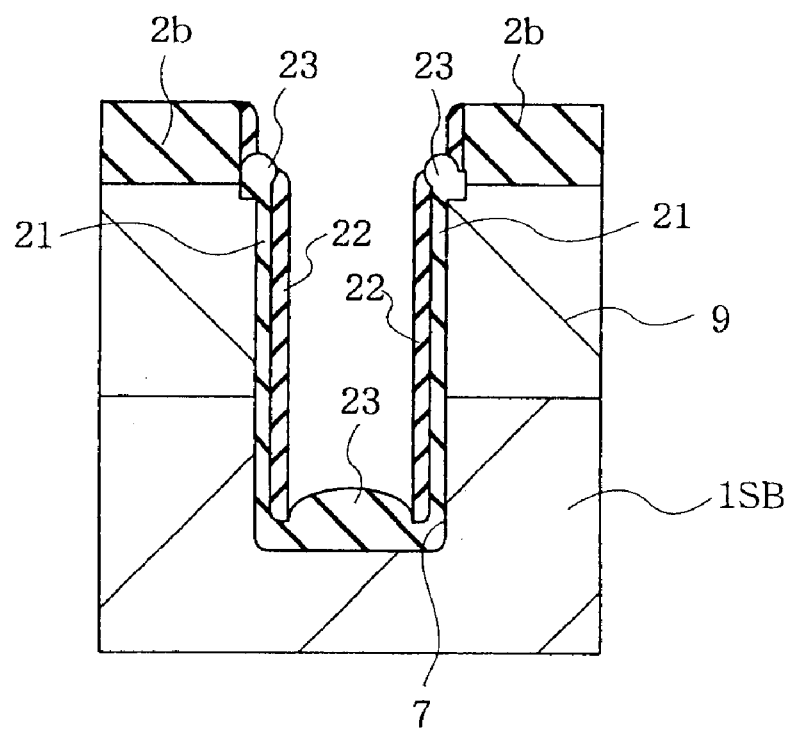
FIG. 11(b) is an enlarged sectional view of the trench in FIG. 11(a)
Figure 12A:
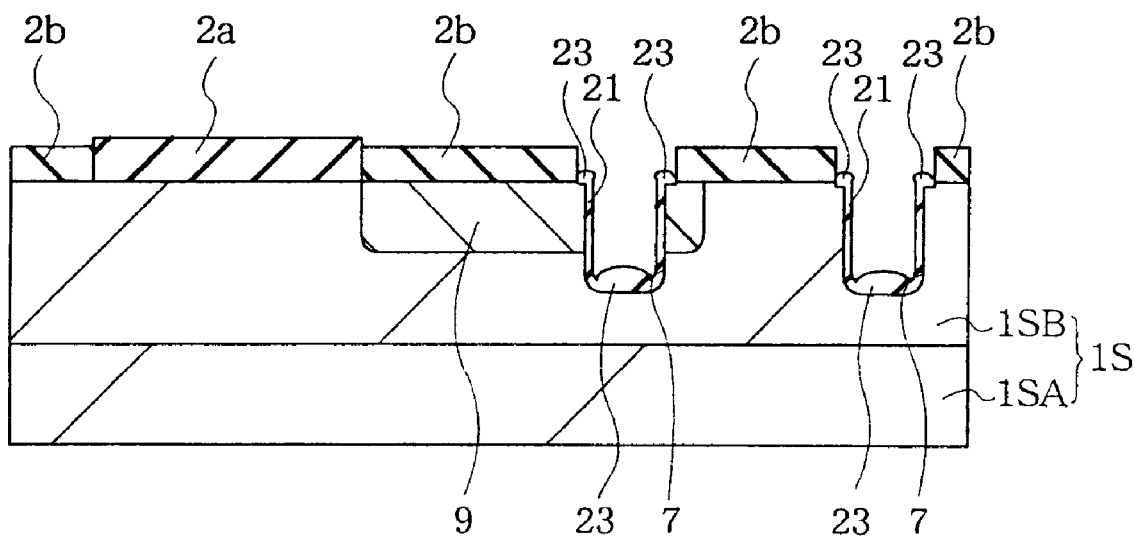
FIG. 12(a) is a detailed sectional view of the semiconductor device during a manufacturing process following FIG. 11
Figure 12B:
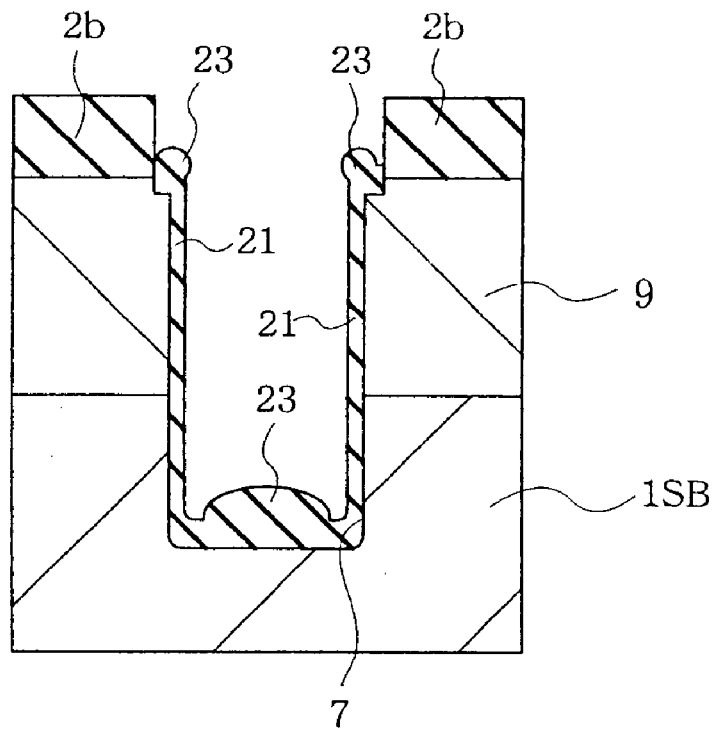
FIG. 12(b) is an enlarged sectional view of the trench in FIG. 12(a)
Figure 13A:
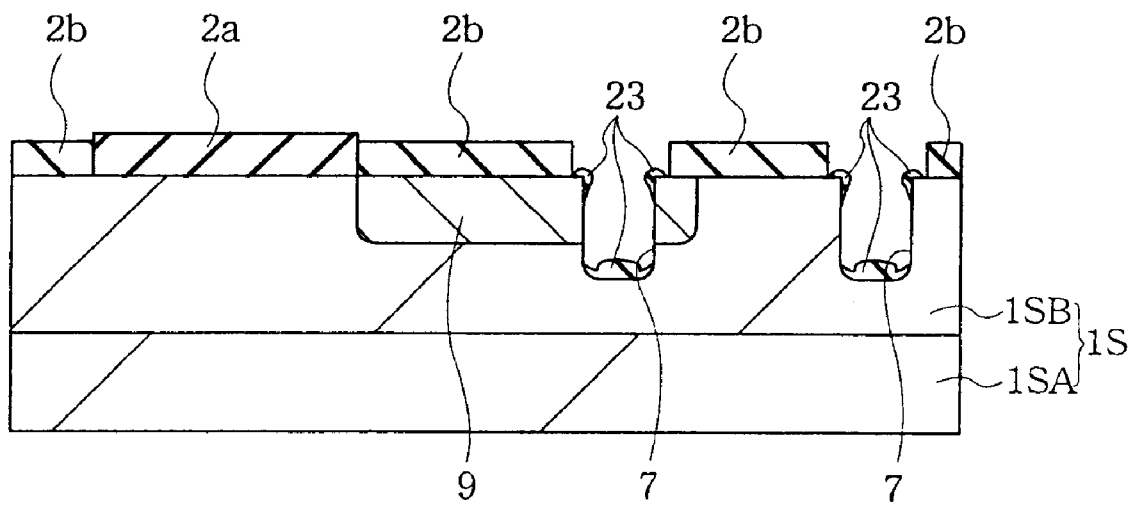
FIG. 13(a) is a detailed sectional view of the semiconductor device during a manufacturing process following FIG. 12
Figure 13B:
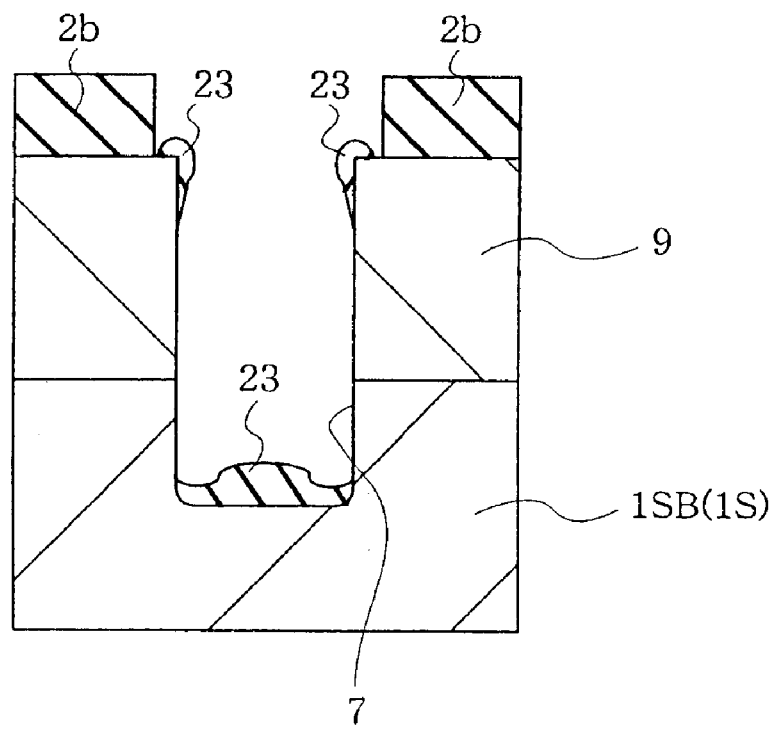
FIG. 13(b) is an enlarged sectional view of the trench in FIG. 13(a)

The semiconductor substrate 1S is cleaned, and then thermal oxidation treatment is performed. Consequently, as shown in FIGS. 11(a) and 11(b), the oxidation-resistant insulator 22 is used as an oxidation-resistant mask to form a thick insulator 23 on exposed portions, that is, the trench 7's bottom and shoulder. At this point, the first embodiment does not form a channel region or a source region. There is no need to consider diffusion of impurities in these regions. Accordingly, high heat processing is applicable to the thermal oxidation treatment. For example, the thick insulator 23 is 9000 Å. As shown in FIGS. 12(a) and 12(b), the oxidation-resistant insulator 22 is removed by using thermal phosphoric acid and the like. Then, the insulator 21 is etched and removed as shown in FIGS. 13(a) and 13(b). The etching amount is enough just for removing the insulator 21 approximately 1000 Å thick, leaving most part of the thick insulator 23 developed on the trench 7's bottom and shoulder.

Figure 14A:
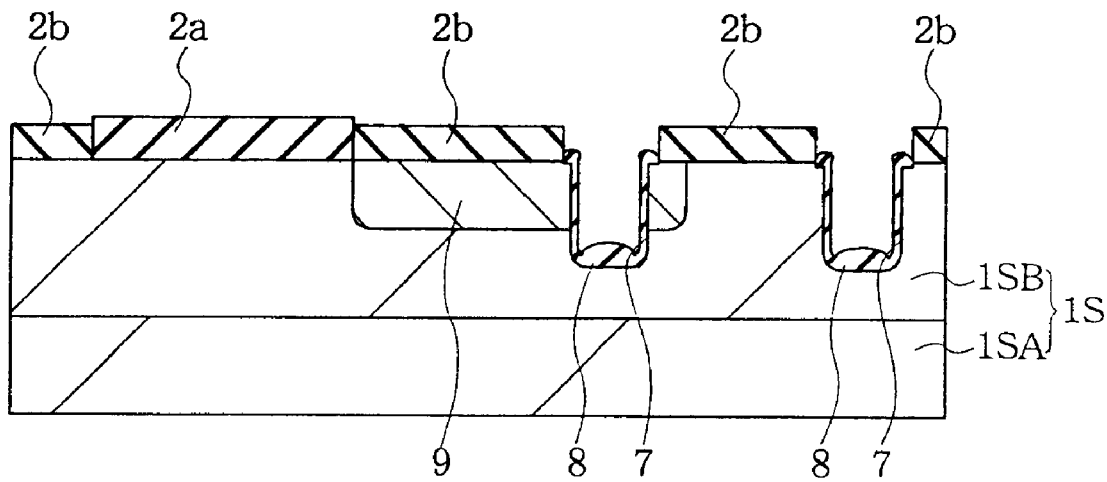
FIG. 14(a) is a detailed sectional view of the semiconductor device during a manufacturing process following FIG. 13
Figure 14B:
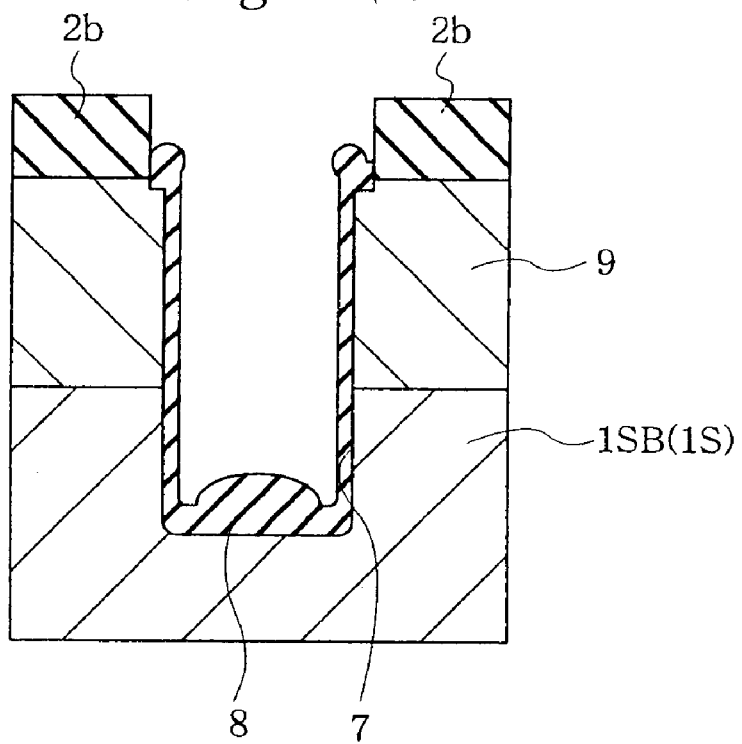
FIG. 14(b) is an enlarged sectional view of the trench in FIG. 14(a)
Figure 15A:
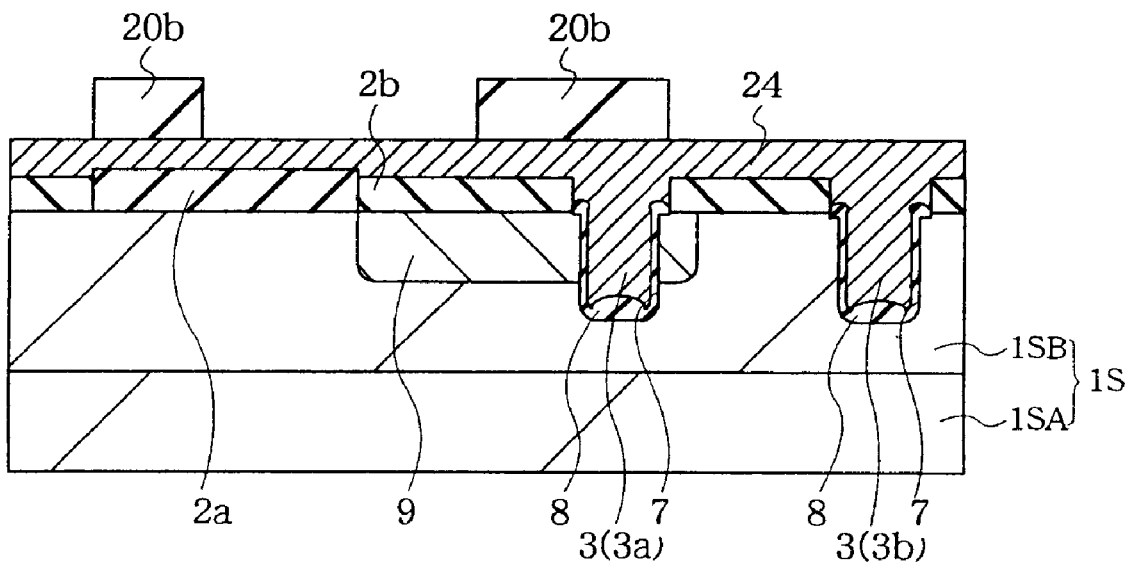
FIG. 15(a) is a detailed sectional view of the semiconductor device during a manufacturing process following FIG. 14
Figure 15B:
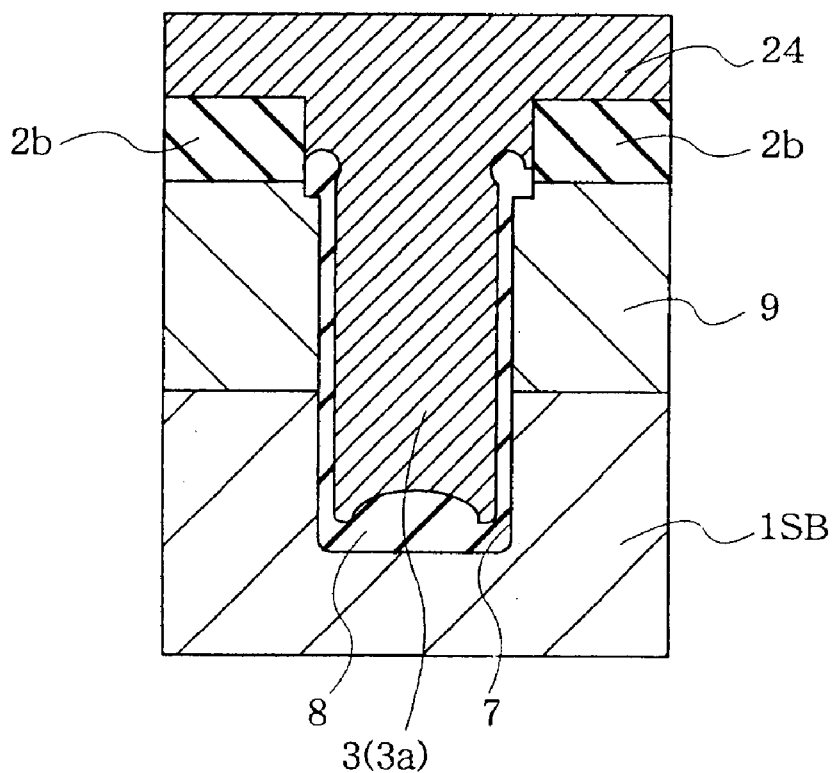
FIG. 15(b) is an enlarged sectional view of the trench in FIG. 15(a)
Figure 16A:
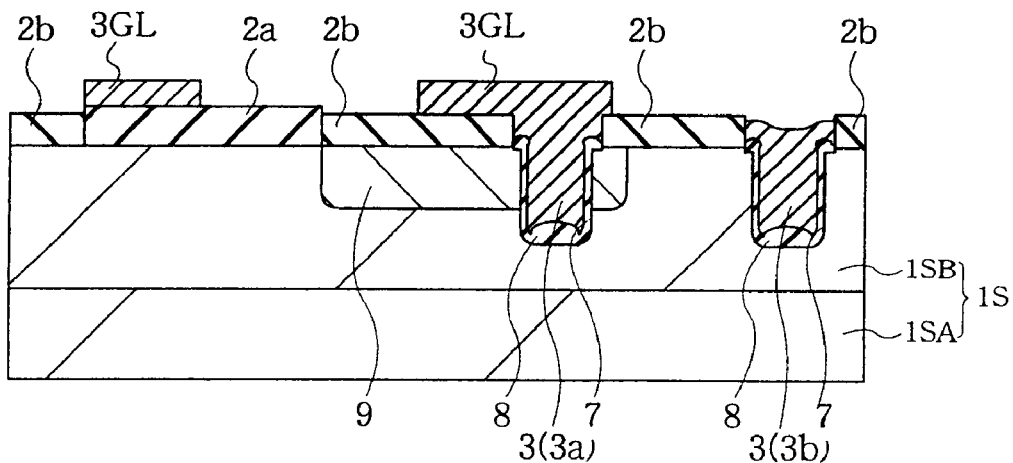
FIG. 16(a) is a detailed sectional view of the semiconductor device during a manufacturing process following FIG. 15.
Figure 16B:
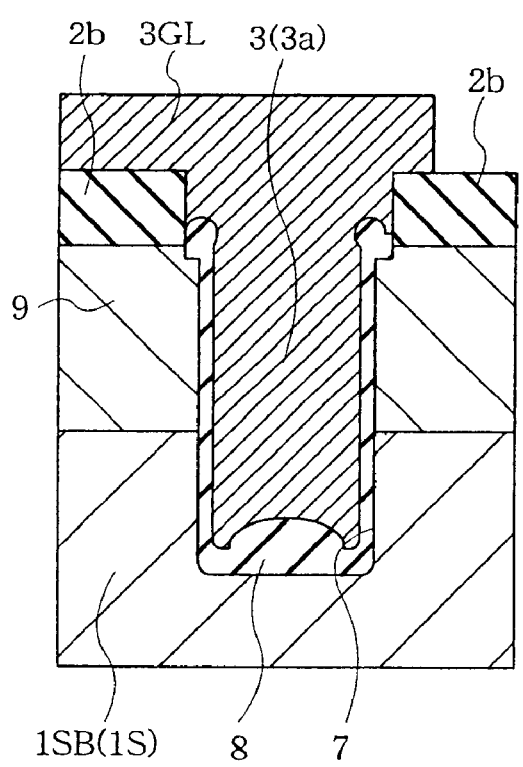
FIG. 16(b) is an enlarged sectional views of the trench in FIG. 16(a) and FIG. 16(c) is an enlarged sectional views of the trench in FIG. 16(a)
Figure 16C:
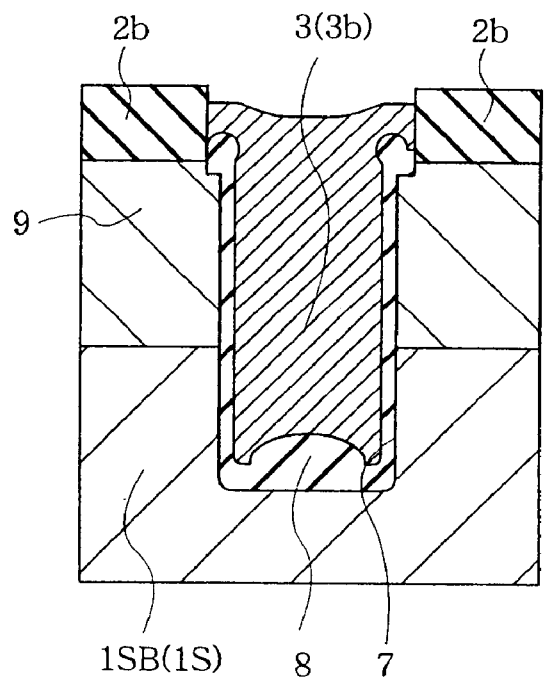

Gate oxidation treatment is applied to the semiconductor substrate 1S. Then, the CVD method or the like is used to deposit an insulator comprising, for example, a silicon oxide film on the semiconductor substrate 1S's principal plane. As shown in FIGS. 14(a) and 14(b), the gate insulator 8 is formed on the trench 7's inner wall face (side face and bottom) and the semiconductor substrate 1S's principal plane exposed from the thick insulator 2b's opening. The gate insulator 8 at the trench 7's bottom and shoulder is thicker than the other portions. Since the thick gate insulator 8 is formed at the bottom of the trench 7, it is possible to decrease a gate-drain capacity and provide a high-speed switching operation. Since the thick gate insulator 8 is formed at the shoulder of the trench 7, it is possible to improve a gate insulation pressure resistance at this shoulder. This also makes it possible to prevent or control destruction of the gate insulation due to an electric field concentrated at corners. Since the thin gate insulator 8 is formed at the trench 7's side face, it is possible to improve a drive capability of the trench power transistor. Further, since the thick insulator 23 is formed at the trench 7's bottom, for example, the insulator coverage may degrade at trench 7's bottom corners and vicinity thereof. Since the gate insulator 8 is formed with an oxidation film and a CVD deposit film, it is possible to improve the gate insulator 8's coverage and the gate insulation pressure resistance. Then, as shown in FIGS. 15(*a*) and 15(*b*), the CVD method or the like is used to deposit a conductor film 24 comprising, for example, a low-resistance polysilicon film on the semiconductor substrate 1S's principal plane. A photo resist film 20*b* is formed so that a gate line formation region is covered and the other portions are exposed. The conductor film 24 is then etched back by using the photo resist film 20*b* as an etching mask. After this process, the gate 3 is formed in the trench 7 and the gate line 3GL is formed integrally thereto as shown in FIGS. 16(*a*) through 16(*c*). For example, an impurity density of the conductor film 24 is approximately 2.0 to $5.0 \times 10^{20}/cm^3$. FIGS. 16(*b*) and 16(*c*) are enlarged sectional views of a gate 3(3*a*) and a gate 3(3*b*), respectively.

Figure 17A:
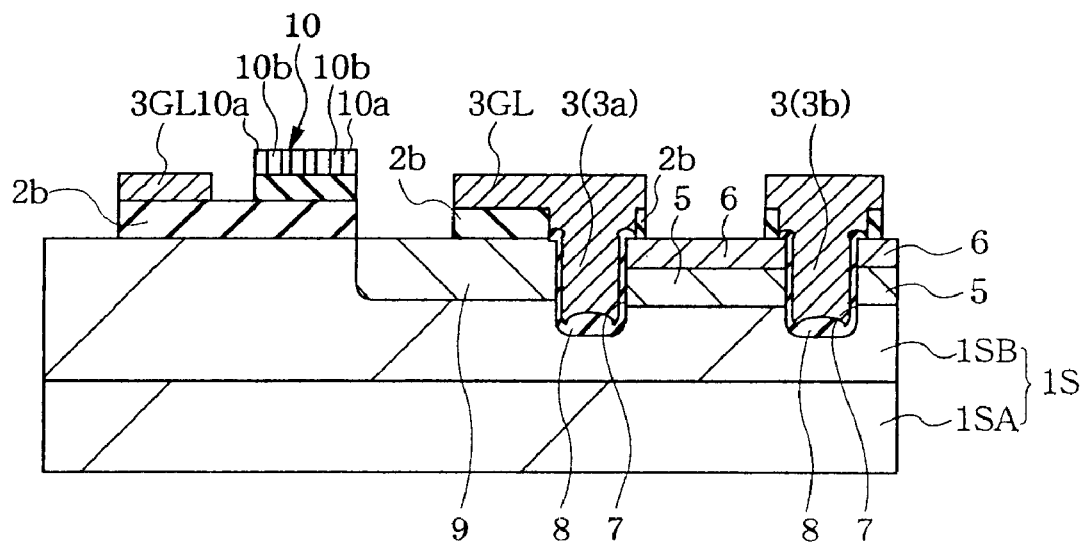
FIG. 17(a) is a detailed sectional view of the semiconductor device during a manufacturing process following FIG. 16.
Figure 17B:
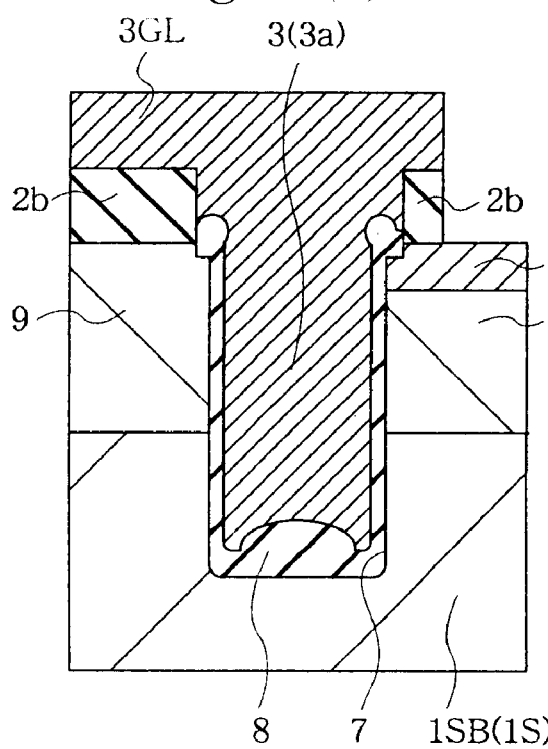
FIG. 17(b) is an enlarged sectional views of the trench in FIG. 17(a) and FIG. 17(c) is an enlarged sectional views of the trench in FIG. 17(a)
Figure 17C:
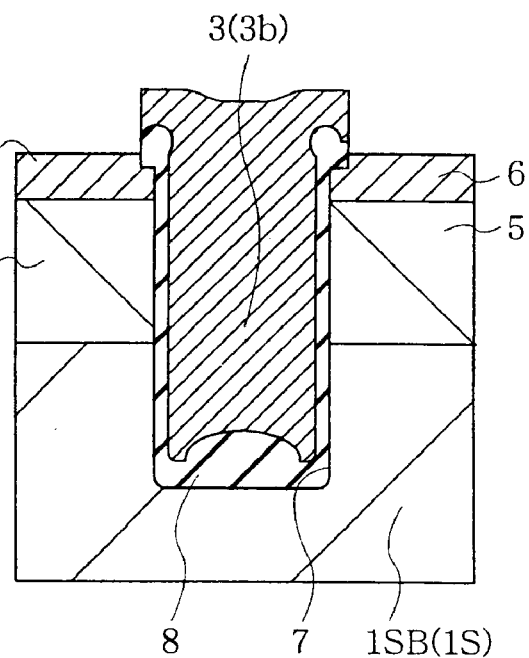

The CVD or the like is used to deposit a conductor film comprising, for example, a low-resistance polysilicon film on the semiconductor substrate 1S's principal plane. This conductor film is patterned to form a conductor film pattern for forming protective diodes. The conductor film pattern is implanted with specified impurities for forming the n$^+$-type semiconductor region 10*a* and the p-type semiconductor region 10*b* alternately and concentrically to form the protective diode 10. Then, the thick insulators 2*a* and 2*b* are etched to expose the principal plane of the semiconductor substrate 1S as shown in FIGS. 17(*a*) through (*c*). FIGS. 17(*b*) and 17(*c*) are enlarged sectional views of a gate 3 (3*a*) and a gate 3(3*b*), respectively. Thereafter, the semiconductor substrate 1S is implanted with, for example, boron for approximately $1.0 \times 10^{13}/cm^2$, and then is subject to a thermal diffusion process to form the channel region 5. The thermal diffusion extends impurities as long as, for example, approximately 1.0 μm. The maximum impurity density for the channel region 5 is, for example, approximately $1.0 \times 10^{17}/cm^3$, namely, over thousandths thinner than the impurity density for the gate 3. Thereafter, the semiconductor substrate 1S is implanted with, for example, arsenic for approximately $5 \times 10^{15}/cm^2$, and then is subject to a thermal diffusion process to form the source region 6. In this first embodiment, the gate 3 is formed, then the channel region 5 and the source region 6 are formed. It is possible to form the channel region 5 and the source region 6 with improved controllability. When a process is made to partially change the gate insulator 8's thickness as in the present invention, various heat treatments are performed for forming the gate insulator 8. Since the channel region 5 and the source region 6 are formed before the gate 3 is formed, however, it is difficult to control depths (ranges) of the channel region 5 and the source region 6. The inventors found it difficult to provide the source region 6 with a shallow junction. Therefore, the first embodiment forms the channel region 5 and the source region 6 after the gate 3 is formed.

Figure 18:
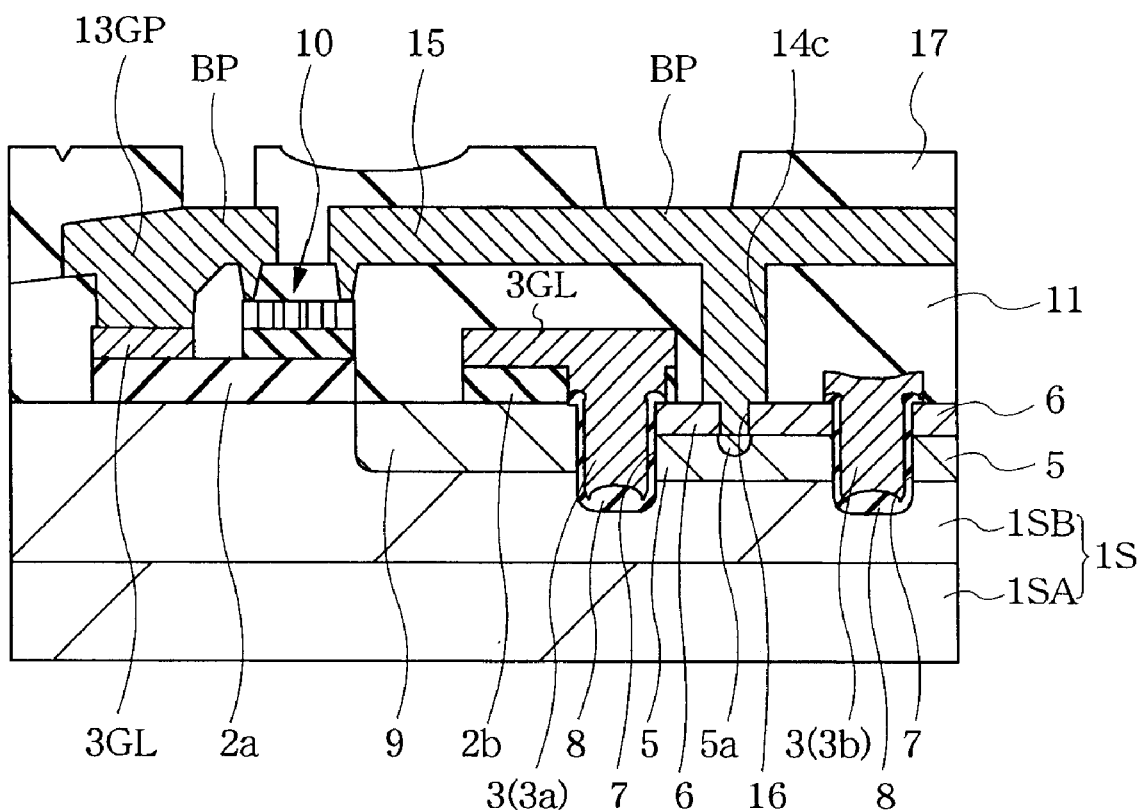
FIG. 18 is a detailed sectional view of the semiconductor device during a manufacturing process following FIG. 17.

Then, as shown in FIG. 18, the inter-layer insulator 11 comprising, for example, a BPSG (Boro Phospho Silicate Glass) film is deposited on the semiconductor substrate 1S's principal plane. Thereafter, contact holes 14*a* through 14*d* are formed in the inter-layer insulator 11, and the hole 16 is formed in the semiconductor substrate 1S. Thereafter, the semiconductor substrate 1S exposed from the contact hole 14*c* and the hole 16 is implanted with, for example, boron to form the p$^+$-type semiconductor region 5*a*. Forming the hole 16 and the p$^+$-type semiconductor region 5*a* will be described in more detail later. For example, titanium tungsten is then deposited on the inter-layer insulator 11. The sputtering method or the like is used for depositing, for example, aluminum, an aluminum-silicon alloy, or an aluminum-silicon-copper alloy thereon. The ordinary photolithography and dry etching technologies are used to pattern the layered conductor film to form the gate electrode 3GP and the source line 15. According to the CVD method using the TEOS gas, an insulator comprising, for example, a silicon oxide film is deposited on the semiconductor substrate 1S's principal plane. An insulator comprising polyimide resin is deposited thereon to form the surface protection film 17. Then, the bonding pad BP is formed by forming an opening which partially exposes the gate electrode and the source line on the surface protection film 17. After the rear of the semiconductor substrate is ground, the vaporization or the like is used to layer, for example, nickel, titanium, nickel, and gold on that rear to form the drain electrode 18 as shown in FIG. 3.

Figure 19:
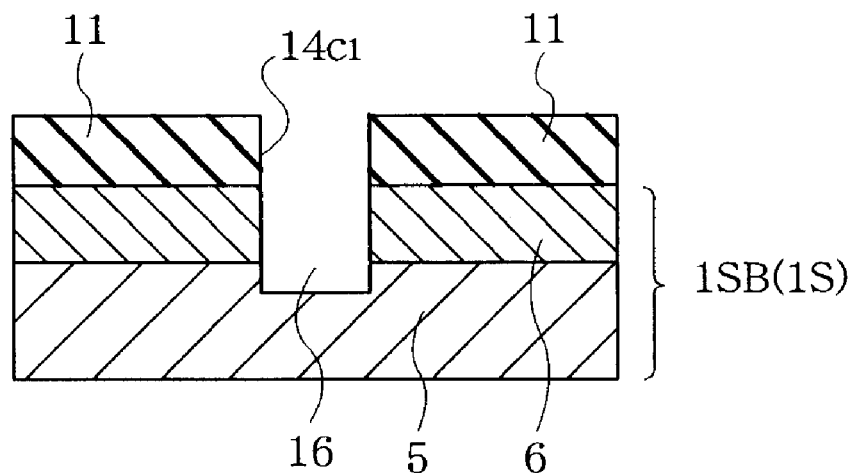
FIG. 19 is a detailed sectional view of a hole and a semiconductor region for the semiconductor device in FIGS. 1 through 3 during a manufacturing process.
Figure 20:
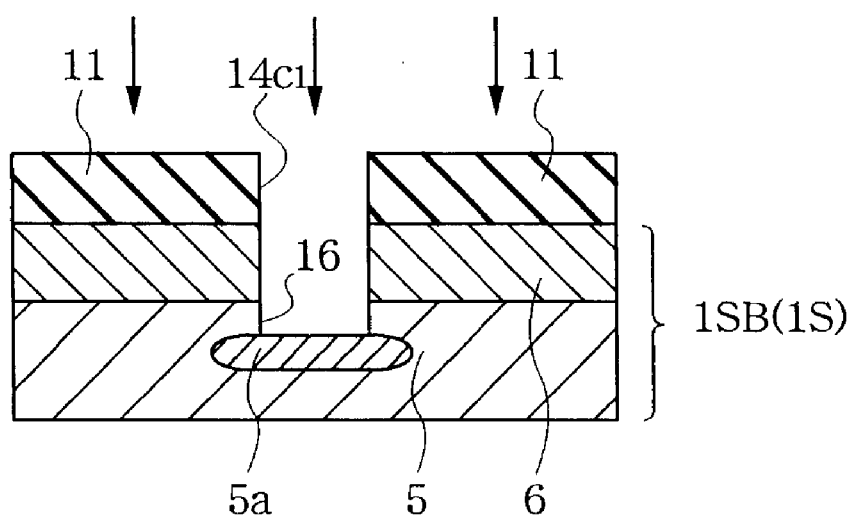
FIG. 20 is a detailed sectional view of the semiconductor device during a manufacturing process following FIG. 19.
Figure 21:
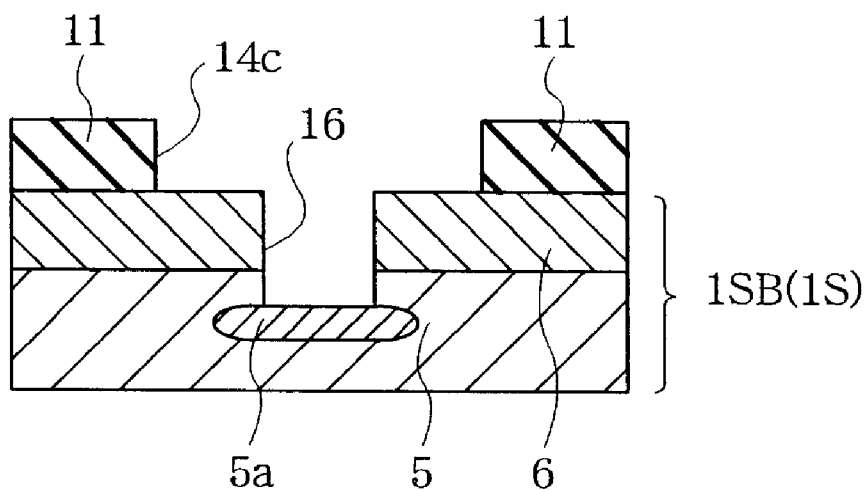
FIG. 21 is a detailed sectional view of the semiconductor device during a manufacturing process following FIG. 20.
Figure 22:
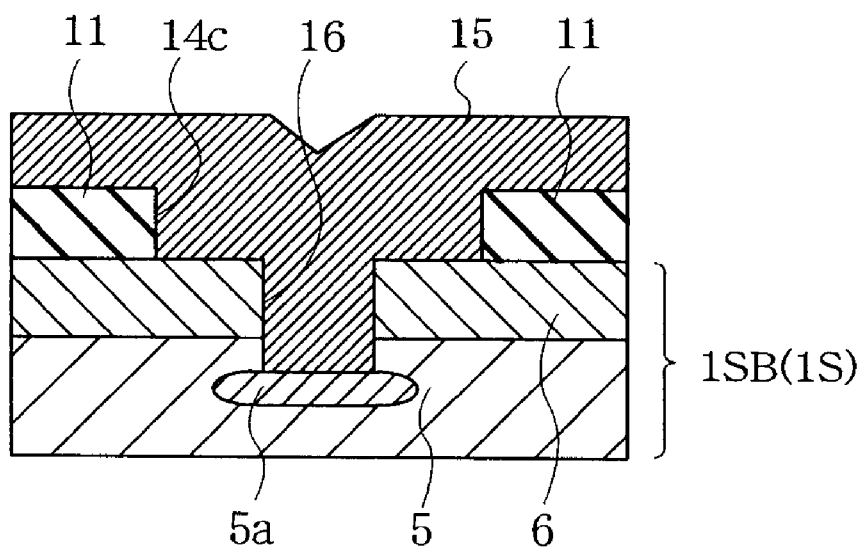
FIG. 22 is a detailed sectional view of the semiconductor device during a manufacturing process following FIG. 21.

For example, the hole 16 and the p$^+$-type semiconductor region 5*a* are formed as follows. As shown in FIG. 19, the ordinary photolithography and dry etching technologies are used to form the contact hole 14*c*1 and the hole 16 on the inter-layer insulator 11 and the semiconductor substrate 1S, respectively. At this stage, the contact hole 14*c*1 and the hole 16 have the same diameter. The hole 16 is deep enough to reach the channel region 5, not the drain region 4. As shown in FIG. 20, impurities comprising, for example, boron and the like are directly implanted into a semiconductor substrate 1S portion (namely the channel region 5) exposed from the contact hole 14*c*. This configuration can form the deep p-type semiconductor region 5*a*, making it possible to improve an avalanche capacity. This method enables the P-layer formation using a mask for contact hole formation, making the P-layer formation mask unnecessary. It is possible to omit a single set of photolithography processing such as applying, exposing, developing, and baking photo resist films. Thereafter, as shown in FIG. 21, the entire wet etching technology is used to form the contact hole 14*c* so that the inter-layer insulator 11 exposes the top face of the source region 6 around the hole 16. As shown in FIG. 22, titanium tungsten is then deposited on the semiconductor substrate 1S. The sputtering method or the like is used for depositing, for example, aluminum, an aluminum-silicon alloy, or an aluminum-silicon-copper alloy thereon. The ordinary photolithography and dry etching technologies are used to pattern the layered conductor film for forming the source line 15. The first embodiment provides a structure which exposes the principal plane and trenches of the source region 6 from the contact hole 14*c*'s bottom face. This structure increases a contact area between the source line 15 and the source region 6, making it possible to decrease a contact resistance between them.

[Second Embodiment]

The second embodiment describes a modified example of forming the gate insulator and the gate in the trench power transistor. The description in the second embodiment uses the sectional views of the gate formation region in the trench power transistor.

Figure 23:
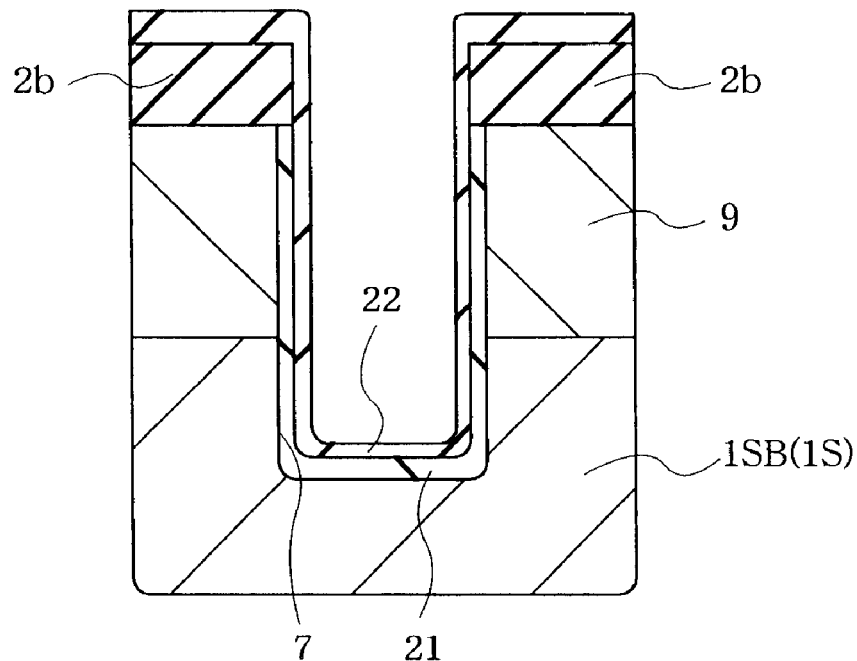
FIG. 23 is a detailed sectional view of a semiconductor device as another embodiment of the present invention during a manufacturing process.
Figure 24:
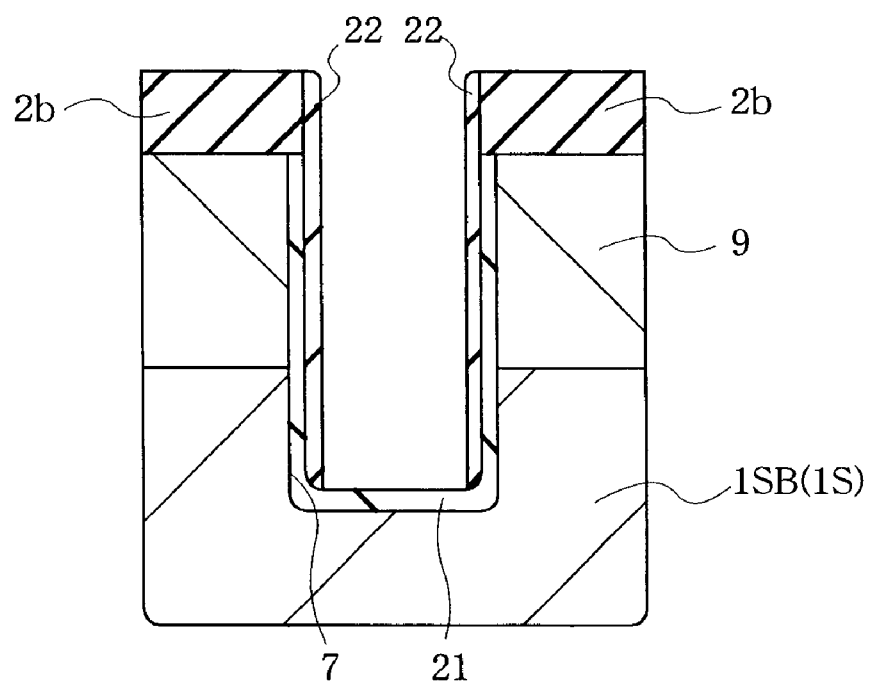
FIG. 24 is a detailed sectional view of the semiconductor device during a manufacturing process following FIG. 23.

After steps in FIGS. 6 through 8 used for the first embodiment, the semiconductor substrate 1S is cleaned. The second embodiment keeps the opening width of the thick insulator 2*b* as shown in FIG. 23, namely maintaining the state in FIG. 8. Like the first embodiment, the thermal oxidation treatment is applied to the semiconductor substrate 1S to form the insulator 21 on the trench 7's inner face (side face and bottom face), and then to deposit the oxidation-resistant insulator 22. The semiconductor substrate is is then etched back. As shown in FIG. 24, the oxidation-resistant insulator 22 is left in the trench 7 and on the opening side face of the thick insulator 2b so that the insulator 21 is exposed from the trench 7's bottom.

Figure 25:
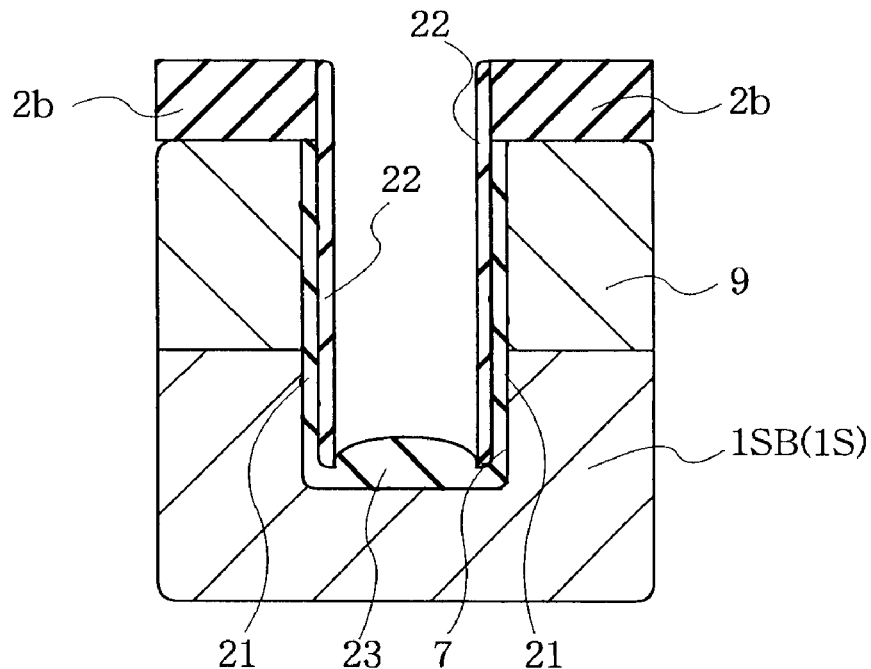
FIG. 25 is a detailed sectional view of the semiconductor device during a manufacturing process following FIG. 24.
Figure 26:
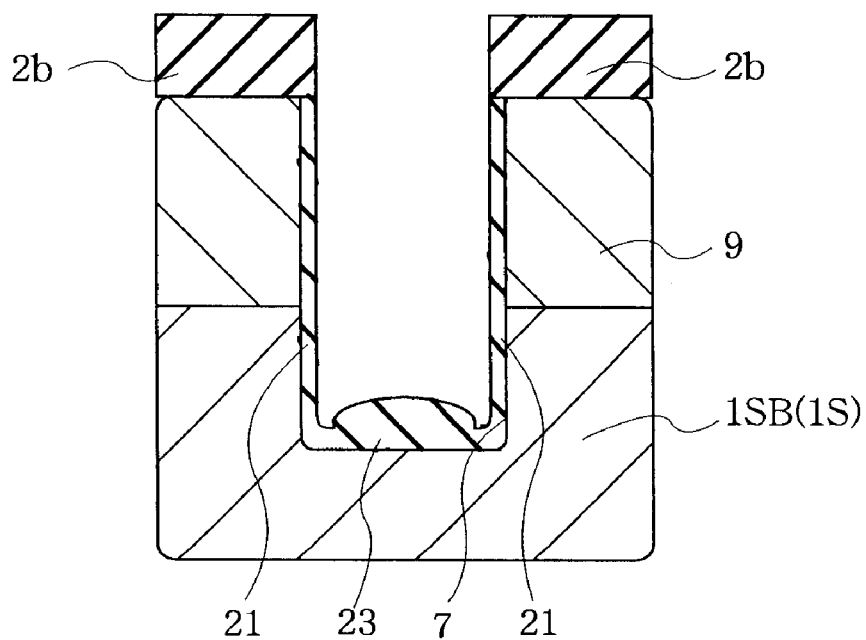
FIG. 26 is a detailed sectional view of the semiconductor device during a manufacturing process following FIG. 25.
Figure 27:
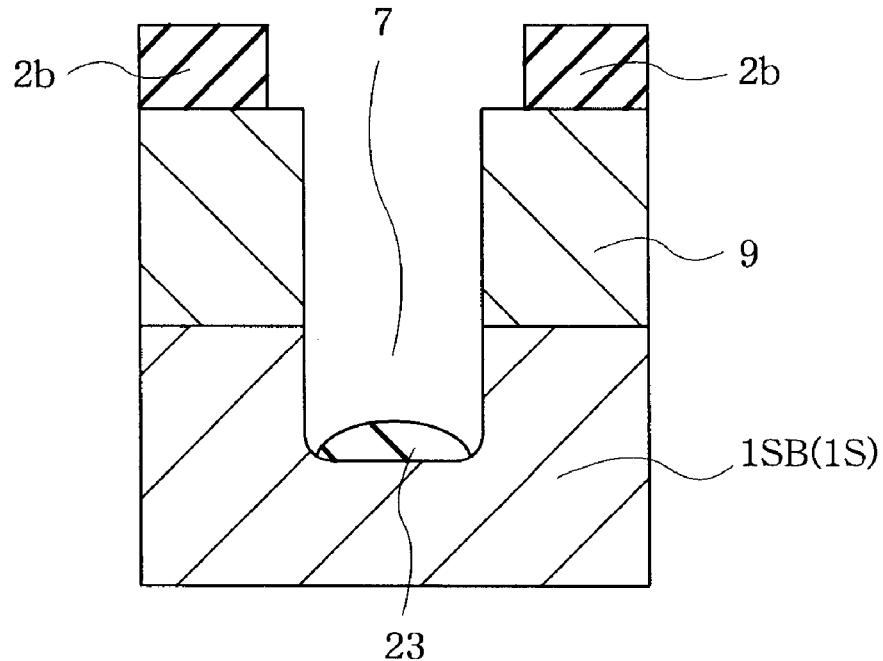
FIG. 27 is a detailed sectional view of the semiconductor device during a manufacturing process following FIG. 26.
Figure 28:
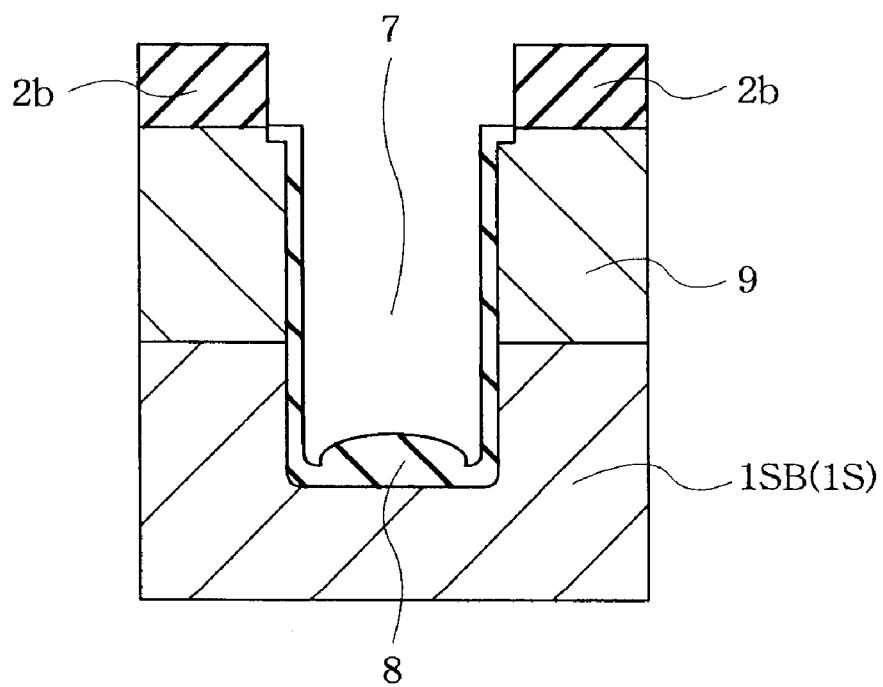
FIG. 28 is a detailed sectional view of the semiconductor device during a manufacturing process following FIG. 27.
Figure 29:
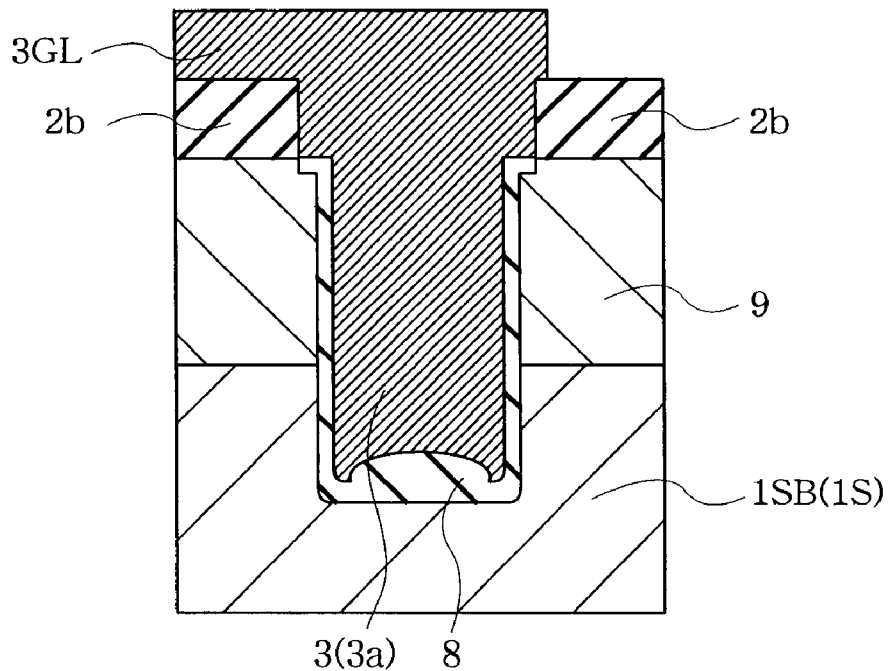
FIG. 29 is a detailed sectional view of the semiconductor device during a manufacturing process following FIG. 28.
Figure 30:
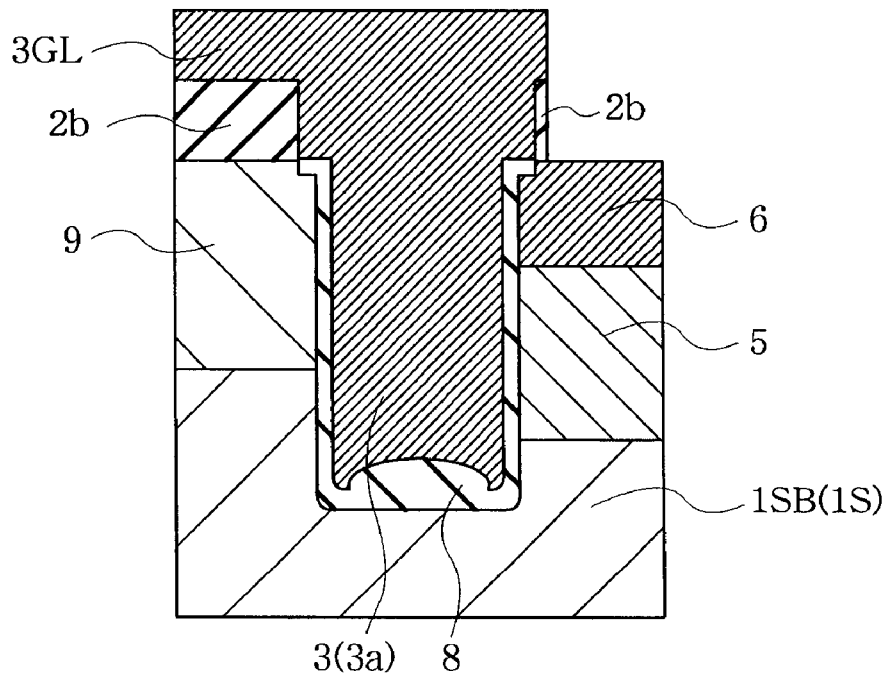
FIG. 30 is a detailed sectional view of the semiconductor device during a manufacturing process following FIG. 29.

Like the first embodiment, the thermal oxidation treatment is applied to the semiconductor substrate is using the oxidation-resistant insulator 22 as a mask. As shown in FIG. 25, the thick insulator 23 is formed only at the trench 7's bottom. Like the first embodiment, the oxidation-resistant insulator 22 is then removed as shown in FIG. 26. Likewise, an etching process is performed to remove the insulator 21. FIG. 27 is a detailed sectional view of the semiconductor substrate 1S after the etching. The thick insulator 23 remains at the bottom of the trench 7. The thick insulator 2b's opening width is larger than the trench 7's width. That is, the thick insulator 2b's opening exposes the semiconductor substrate 1S's principal plane. The gate oxidation treatment is applied to the semiconductor substrate 1S to form the gate insulator 8. As shown in FIG. 28, it is formed on the trench 7's inner face (side face and bottom face) and on the semiconductor substrate 1S's principal plane exposed from the thick insulator 2b's opening. Since the thick insulator 23 remains on the trench 7's bottom, the relatively thick gate insulator 8 can be formed. Like the first embodiment, a conductor film for line formation is deposited on the semiconductor substrate 1S's principal plane. This conductor film is patterned to form the gate 3 and the gate line 3GL as shown in FIG. 29. Like the first embodiment, the channel region 5 and the source region 6 are formed on the semiconductor substrate 1S as shown in FIG. 30. The steps to follow are same as those for the first embodiment. Therefore, the description thereof is omitted.

[Third Embodiment]

The third embodiment describes another modified example of forming the gate insulator and the gate in the trench power transistor. The description in the third embodiment also uses the sectional views of the gate formation region in the trench power transistor.

Figure 31:
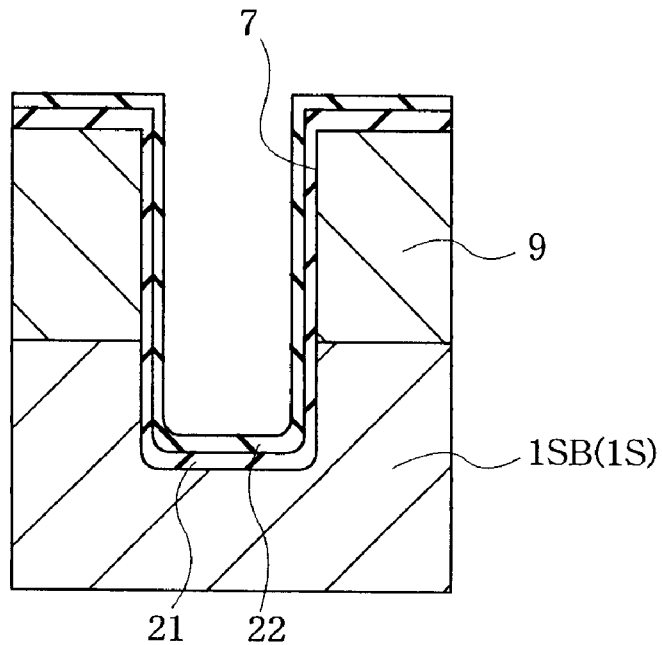
FIG. 31 is a detailed sectional view of a semiconductor device as still another embodiment of the present invention during a manufacturing process.
Figure 32:
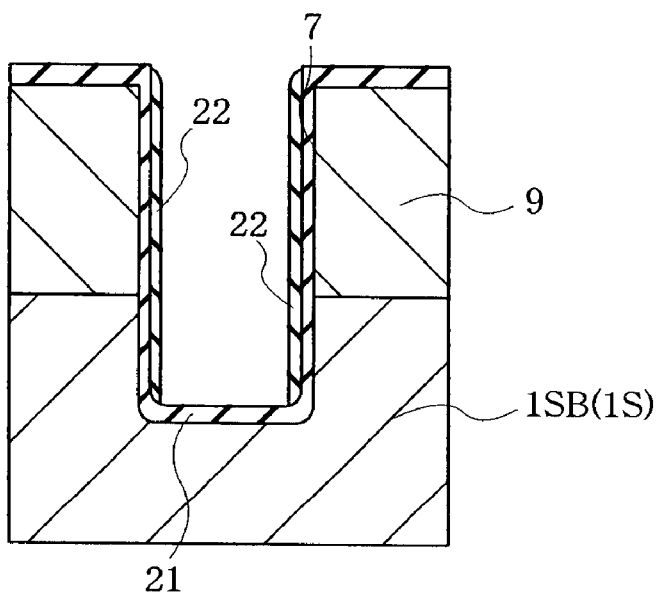
FIG. 32 is a detailed sectional view of the semiconductor device during a manufacturing process following FIG. 31.
Figure 33:
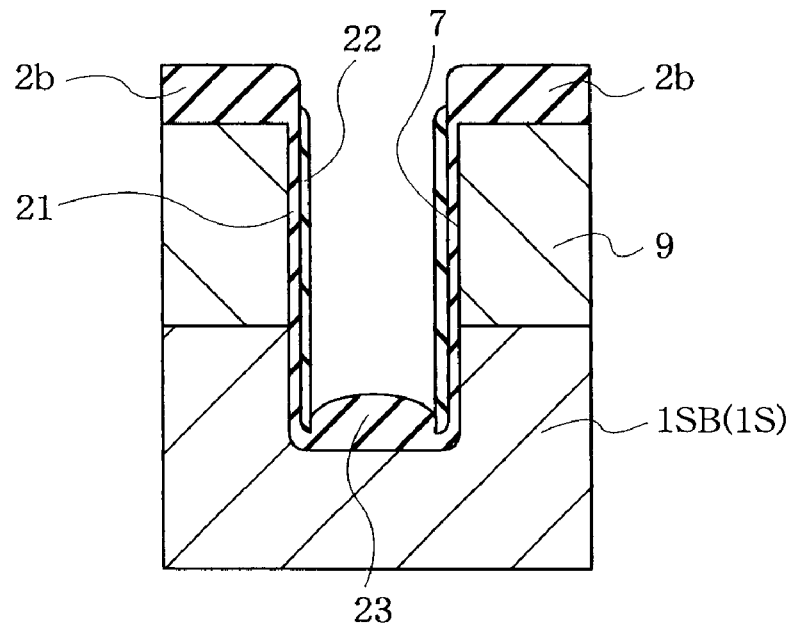
FIG. 33 is a detailed sectional view of the semiconductor device during a manufacturing process following FIG. 32.
Figure 34:
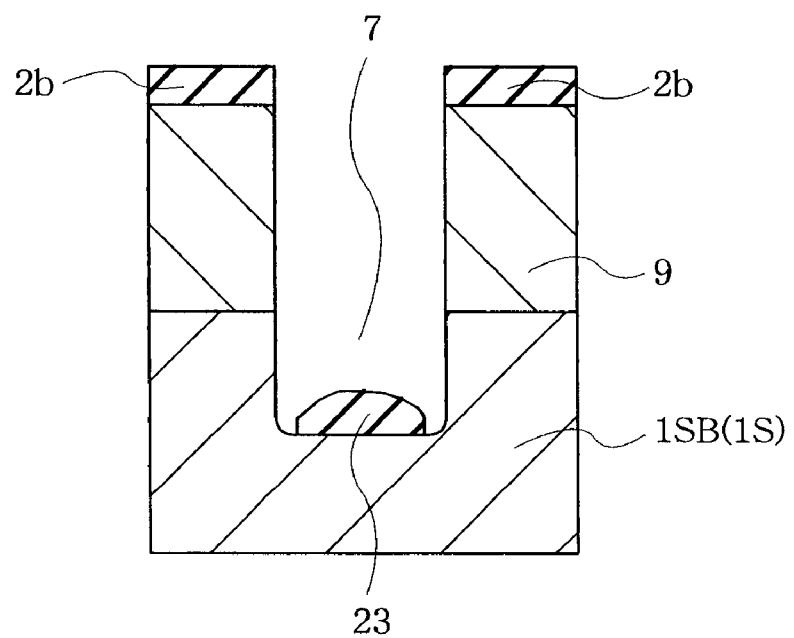
FIG. 34 is a detailed sectional view of the semiconductor device during a manufacturing process following FIG. 33.
Figure 35:
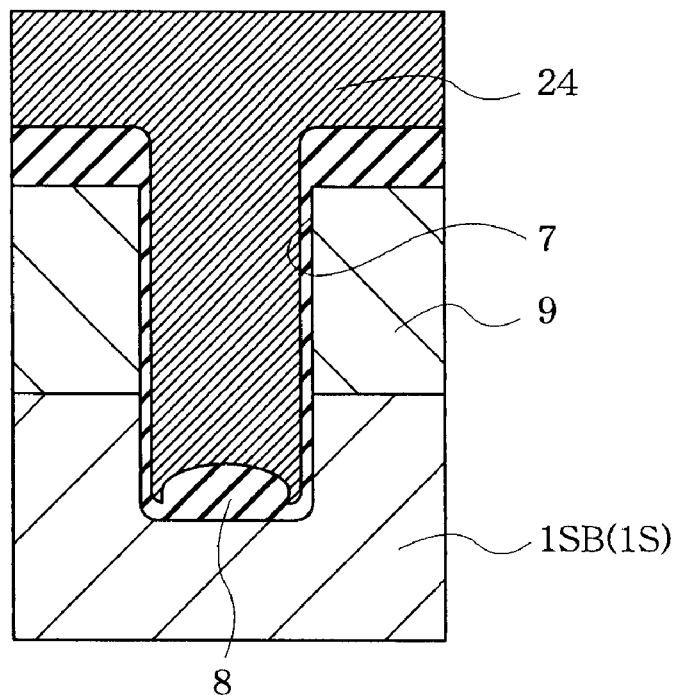
FIG. 35 is a detailed sectional view of the semiconductor device during a manufacturing process following FIG. 34.
Figure 36:
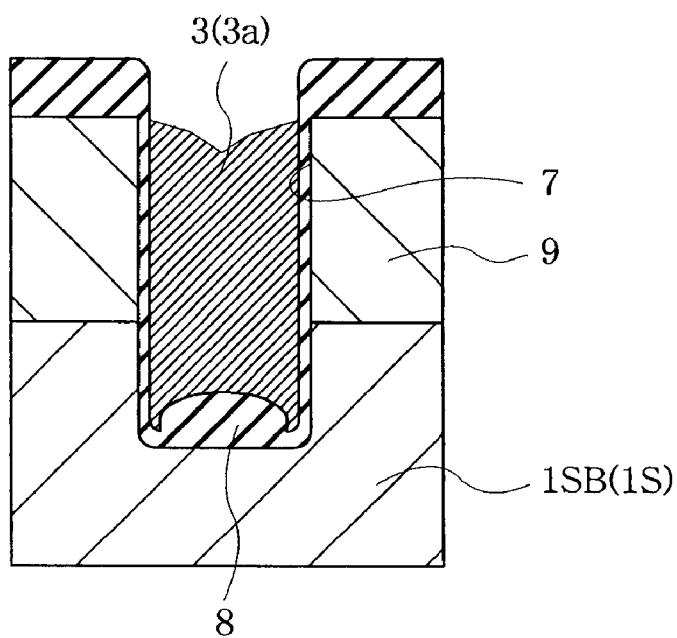
FIG. 36 is a detailed sectional view of the semiconductor device during a manufacturing process following FIG. 35.
Figure 37:
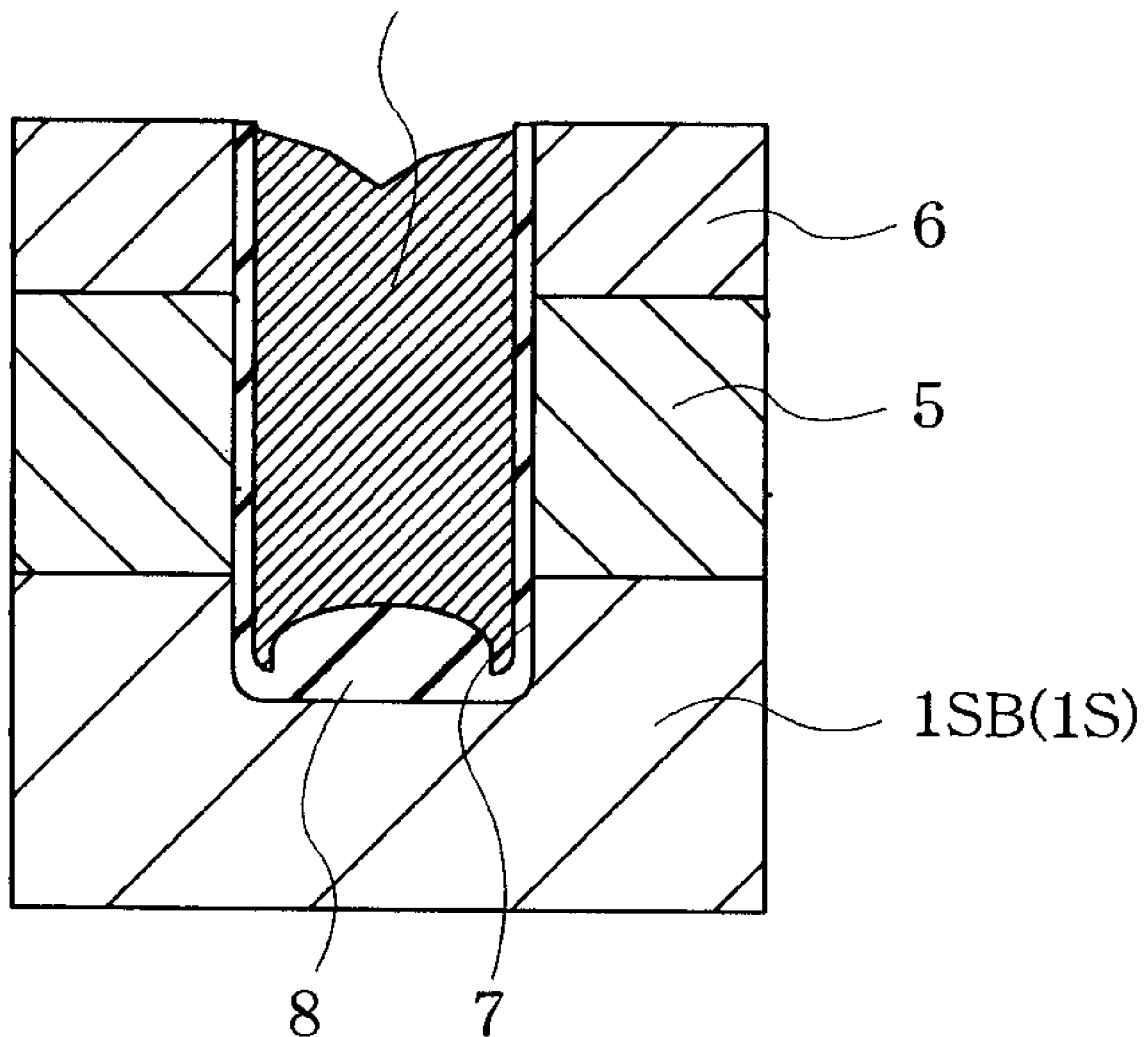
FIG. 37 is a detailed sectional view of the semiconductor device during a manufacturing process following FIG. 36.

Like the first embodiment, the trench 7 is formed on the semiconductor substrate 1S as shown in FIG. 31. The thermal oxidation treatment is then applied to the semiconductor substrate 1S to form the insulator 21 on the trench 7's inner face (side face and bottom face). After the oxidation-resistant insulator 22 is deposited, an etchback process is performed to leave the oxidation-resistant insulator 22 on the trench 7's inner side face and expose the insulator 21 from the trench 7's bottom and the semiconductor substrate 1S's principal plane as shown in FIG. 32. Like the first embodiment, the thermal oxidation treatment is applied to the semiconductor substrate 1S using the oxidation-resistant insulator 22 as a mask. As shown in FIG. 33, the thick insulators 23 and 2b are formed on the trench 7's bottom face and the semiconductor substrate 1S's principal plane, respectively. Like the first embodiment, the oxidation-resistant insulator 22 and the insulator 21 are removed as shown in FIG. 34. Like the first embodiment, the thick insulator 23 remains on the trench 7's bottom at this phase. Then, the gate oxidation treatment is applied to the semiconductor substrate 1S to form the gate insulator 8 on the trench 7's inner face (side face and bottom face) as shown in FIG. 35. Since the thick insulator 23 remains on the trench 7's bottom, the relatively thick gate insulator 8 can be formed. Like the first embodiment, a conductor film for line formation is deposited on the semiconductor substrate 1S's principal plane. This conductor film is patterned to form the gate 3 as shown in FIG. 36. Like the first embodiment, the channel region 5 and the source region 6 are formed on the semiconductor substrate 1S as shown in FIG. 37. The steps to follow are same as those for the first embodiment. Therefore, the description thereof is omitted.

[Fourth Embodiment]

The fourth embodiment describes still another modified example of forming the gate insulator and the gate in the trench power transistor. The description in the fourth embodiment also uses the sectional views of the gate formation region in the trench power transistor.

Figure 38:
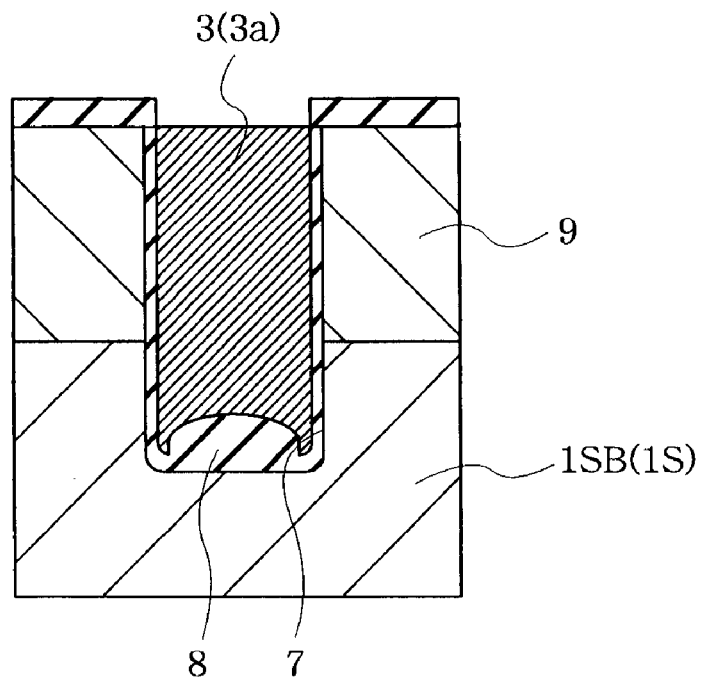
FIG. 38 is a detailed sectional view of a semiconductor device as yet another embodiment of the present invention during a manufacturing process.
Figure 39:
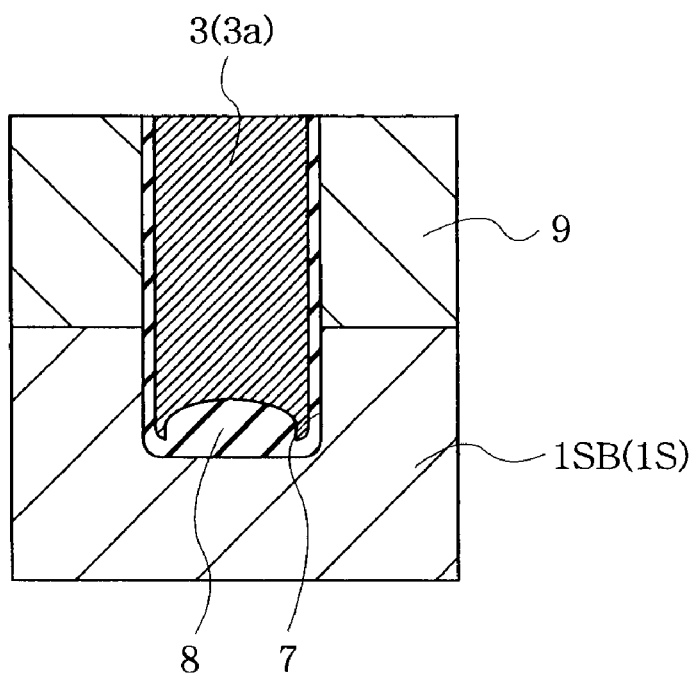
FIG. 39 is a detailed sectional view of the semiconductor device during a manufacturing process following FIG. 38.
Figure 40:
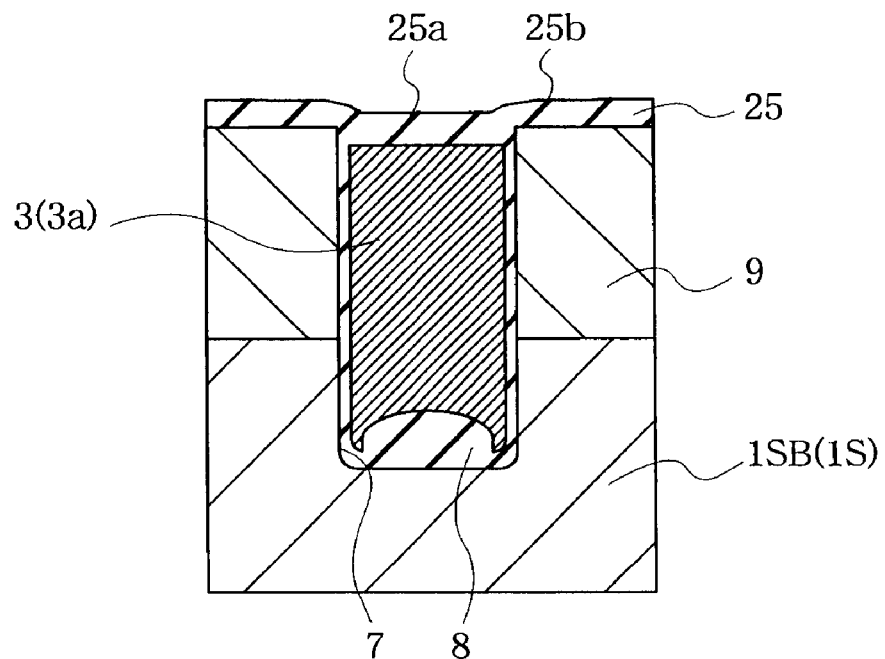
FIG. 40 is a detailed sectional view of the semiconductor device during a manufacturing process following FIG. 39.
Figure 41:
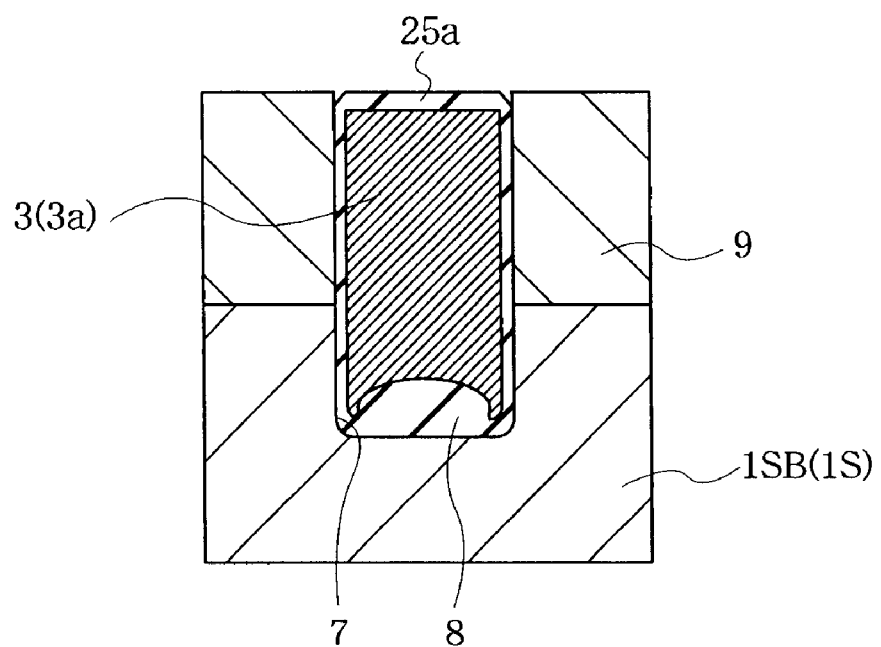
FIG. 41 is a detailed sectional view of the semiconductor device during a manufacturing process following FIG. 40.

After completion of steps up to FIG. 35 described in the third embodiment, the conductor film for line formation is etched back so that its top face becomes flat to form the gate 3 in the trench 7 as shown in FIG. 38. At this stage, the top face of the gate 3 is almost level with the semiconductor substrate 1S's principal plane and is flattened. The insulator is removed from the semiconductor substrate 1S' principal plane to expose the principal plane as shown in FIG. 39. The thermal oxidation treatment is applied to the semiconductor substrate 1S and, as shown in FIG. 40, an insulator 25 (25a and 25b) comprising, for example, a silicon oxide film is formed on the entire surface of the semiconductor substrate 1S's principal plane and on the top of the gate 3. At this time, the impurity density of the gate 3 is higher than that of the semiconductor substrate 1S, particularly of the epitaxial layer 1SB with a low impurity density in this case. Due to accelerated oxidation, the insulator 25a formed on the gate 3 becomes thicker than the insulator 25b formed on the semiconductor substrate 1S's principal plane. Then, dry etching is applied to the semiconductor substrate 1S to leave the insulator 25a on the gate 3 and remove the insulator 25b from the semiconductor substrate 1S. FIG. 41 is a sectional view of the semiconductor substrate 1S after this processing.

Figure 42:
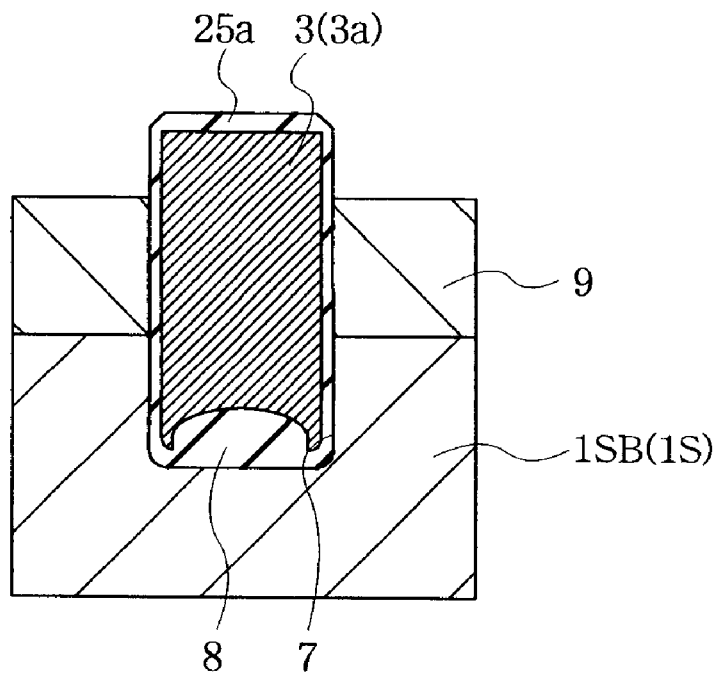
FIG. 42 is a detailed sectional view of the semiconductor device during a manufacturing process following FIG. 41.
Figure 43:
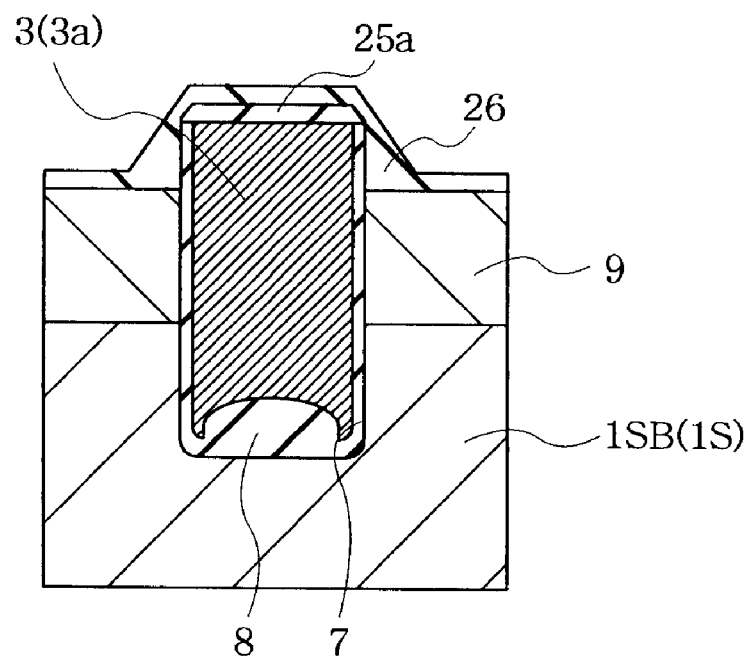
FIG. 43 is a detailed sectional view of the semiconductor device during a manufacturing process following FIG. 42.

Then, as shown in FIG. 42, the top of the semiconductor substrate 1S is selectively etched and removed. For example, dry etching using the CF4 gas and the like is performed to selectively remove silicon with reference to the silicon oxide film. This process makes the semiconductor substrate 1S's principal plane lower than the gate 3's top face. Namely, the gate 3's top face is made to be level with or higher than the principal plane of the semiconductor substrate 1S as a source region. This structure prevents the above-mentioned source offset, making it possible to provide the source region with shallow junctions. Subsequently, the thermal oxidation treatment is applied to the semiconductor substrate 1S to remove a damage due to the above-mentioned etching and to form the insulator 26 for reinforcing the gate insulator 8 and the insulator 25a as shown in FIG. 43. The steps to follow are same as those for the first embodiment. Therefore, the description thereof is omitted.

[Fifth Embodiment]

The fifth embodiment explains a modified example of the fourth embodiment. The description in the fifth embodiment also uses the sectional views of the gate formation region in the trench power transistor.

Figure 44:
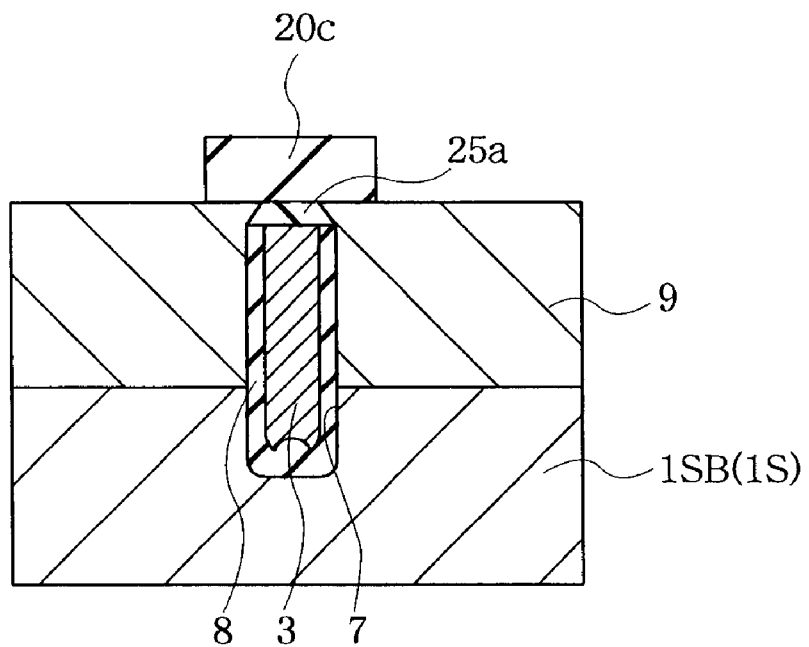
FIG. 44 is a detailed sectional view of a semiconductor device as still yet another embodiment of the present invention during a manufacturing process.
Figure 45:
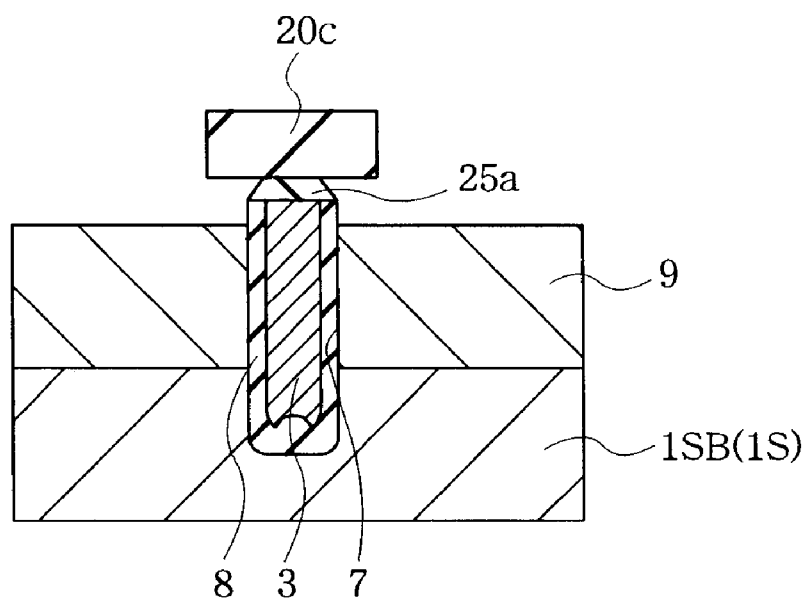
FIG. 45 is a detailed sectional view of the semiconductor device during a manufacturing process following FIG. 44.

After completion of steps up to FIG. 41 described in the fourth embodiment, a photo resist film 20 is patterned so as to cover the insulator 25a on the gate 3 as shown in FIG. 44. Then, isotropic etching is performed to selectively etch and remove the semiconductor substrate 1S with reference to the insulator 25a and the gate insulator 8 by using the photo resist film 20c as an etching mask. As shown in FIG. 45, the semiconductor substrate 1S's principal plane becomes lower than the gate 3's top face. The insulator 25a may be weakly structured since it is formed by the accelerated oxidation method and the like. When the semiconductor substrate 1S is etched and removed, the etching gas may enter the gate 3 to etch and remove it. The fifth embodiment solves this problem by protecting the insulator 25a with the photo resist film 20c before etching. It is possible to make the gate 3's top face level with or higher than the semiconductor substrate 1S's top face. Accordingly, the semiconductor device reliability can be improved. The source region can have shallow junctions. Thereafter, the photo resist film 20c is removed for manufacturing the trench power transistor in the same manner as for the first and fourth embodiments.

[Sixth Embodiment]

Figure 46:
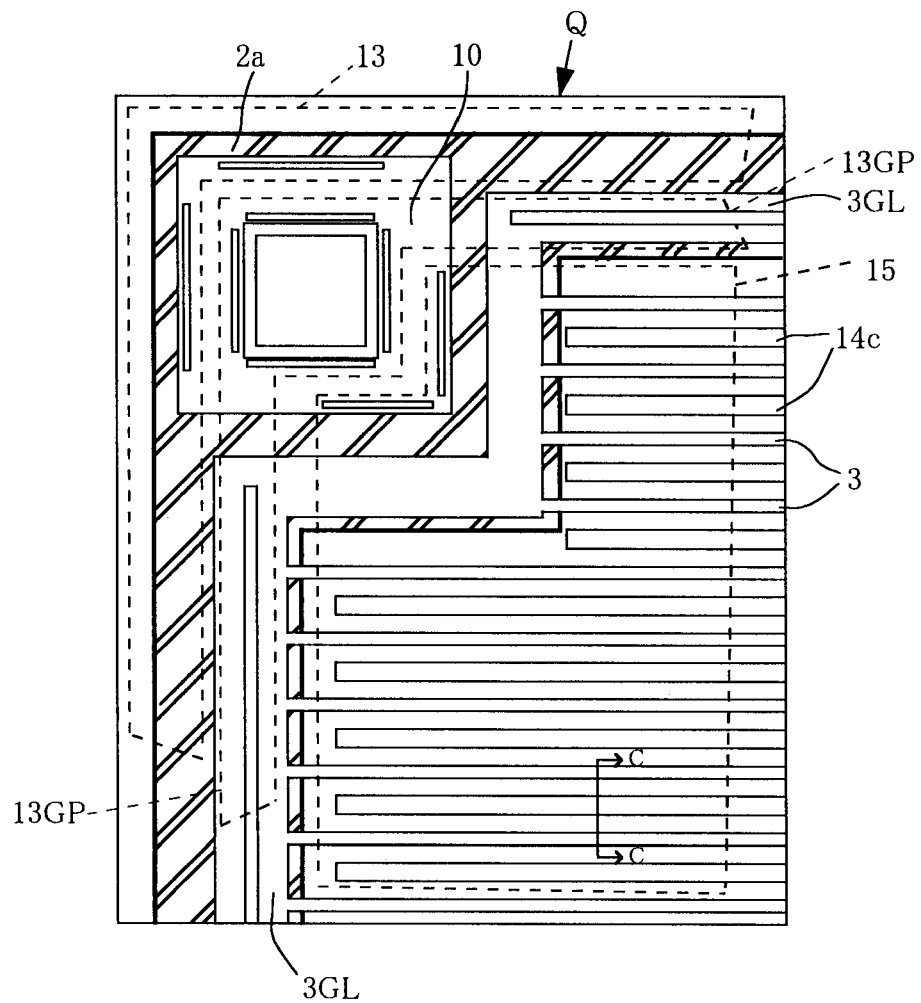
FIG. 46 is a detailed plan view of a semiconductor device as another embodiment of the present invention.
Figure 47:
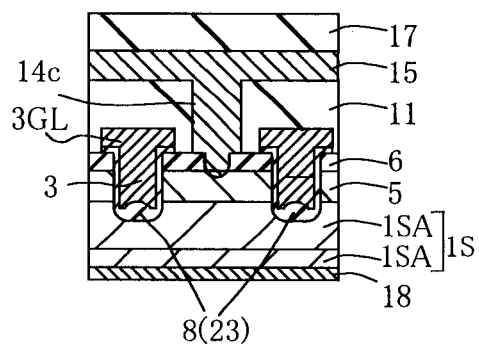
FIG. 47 is a sectional view taken in the line C—C of FIG. 46.

As shown in FIG. 2, the above-mentioned embodiments use a mesh-type layout pattern for gates. As shown in FIG. 46 (partial layout), it is possible to use a stripe-type layout pattern for gates. FIGS. 46 and 47 illustrate the sixth embodiment. The same numerals are used for functions or structural components corresponding to those described in the above-mentioned embodiments. The description thereof is omitted.

According to a stripe-type structure as shown in FIG. 46, gates 3 are arranged alternately and parallel on the semiconductor substrate is in a specified direction. The gate stripe has an advantage of decreasing a required space compared to the mesh type. If a gate's trench width is narrowed for decreasing the required space, gates are provided only parallel, causing a problem of increasing a gate serial resistance. In such a case, the present invention can decrease a stray capacity and prevent a decrease in electrical characteristics based on a time constant. As will be apparent from the partially sectional view in FIG. 47 of the present invention, the gate insulator 8's trench bottom is provided with the insulator 23 thicker than a gate insulator on the trench wall side. This structure can decrease a trench power transistor's gate-drain capacity (Cgd). As a result, it is possible to provide a transistor having improved frequency characteristics or a switching speed.

While there have been described specific preferred embodiments of the present invention, it is to be distinctly understood that the present invention is not limited thereto but may be otherwise variously embodied within the spirit and scope of the invention.

For example, the present invention is applicable to an IGBT (Insulated Gate Bipolar Transistor) having the trench-gate structure and the like other than power transistors.

The present invention by the inventors have been explained chiefly with respect to a DC-DC converter as the background field of application, but is not limited thereto. The present invention is also applicable to other semiconductor devices.

The following summarizes advantageous effects provided by the present invention disclosed in this specification.

(1) According to the present invention, the gate insulator at the trench bottom where the drain region is formed is made thicker than the gate insulator at the trench side face where the channel region is formed. It is possible to decrease a gate-drain capacity for the trench power transistor and improve a switching speed of the trench power transistor.

(2) According to the present invention, the gate insulator at the trench side face where the channel region is formed is made thinner than the gate insulator at the trench bottom where the drain region is formed. It is possible to improve the trench power transistor's drive capability.

(3) According to the present invention, after the gate insulator is formed, an insulator is formed on the surface thereof by means of the chemical vapor growth. It is possible to improve the insulator coverage in the trench, the gate insulation pressure resistance of the trench power transistor, and accordingly the trench power transistor's reliability.

(4) According to the present invention, the gate's top face is made higher than the semiconductor substrate's principal plane, preventing a source offset in which the gate slips off the source region. This can improve controllability for the source region and shallow junctions for the source region of the trench power transistor. Accordingly, it is possible to improve the trench power transistor's performance.

(5) According to the present invention, after the gate is formed, impurities are implanted for forming the source region and the channel region. This can improve controllability for the source region and the channel region and shallow junctions for the source region of the trench power transistor. Accordingly, it is possible to improve the trench power transistor's performance.

What is claimed is:

1. A manufacturing method of semiconductor device, comprising the steps of:

(a) forming a trench in a semiconductor substrate;

(b) forming a gate insulator in said trench so that a trench bottom becomes thicker than a trench side face;

(c) forming a gate in said trench after forming said gate insulator;

(d) implanting impurities for forming a channel region in said semiconductor substrate after forming said gate formation step; and (e) implanting impurities for forming a source region in said semiconductor substrate after forming said gate formation step;

wherein said step (a) further comprises the steps of:

forming a first insulator on a principal plane of said semiconductor substrate;

forming an opening by removing a formation region for said trench from said first insulator; and forming said trench by removing a semiconductor substrate exposed from said opening by using said first insulator as a mask;

wherein said method further comprises the step of making said first insulator's opening larger than said trench after said step (a) and before said step (b); and wherein said step (b) further comprises the steps of:

forming a second insulator on an inner face of said trench;

forming an oxidation-resistant third insulator on a surface of said second insulator;

leaving said third insulator on a side face of said trench by etching back said third insulator;

selectively forming a thick insulator on a region exposed from said third insulator on said semiconductor substrate by applying oxidation treatment to said semiconductor substrate;

removing said third insulator and then removing said second insulator; and forming a gate insulator so that a semiconductor substrate's principal plane portion exposed from said first insulator's opening and said trench bottom become thicker than a trench side face by applying oxidation treatment to said semiconductor substrate after said step of removing said second insulator, and said step (c) further comprises the steps of:

depositing a conductor film in said trench and on said semiconductor substrate's principal plane; and forming said gate with a T-shaped cross section by etching back said conductor film.

2. The manufacturing method of semiconductor device according to claim 1, comprising the step of depositing an insulator on a surface of said gate insulator by means of chemical vapor growth after said step of forming a gate insulator.

3. A manufacturing method of semiconductor device, comprising the steps of:

(a) forming a trench in a semiconductor substrate;

(b) forming a gate insulator in said trench so that a trench bottom becomes thicker than a trench side face;

(c) forming a gate in said trench after forming said gate insulator;

(d) implanting impurities for forming a channel region in said semiconductor substrate after forming said gate formation step; and (e) implanting impurities for forming a source region in said semiconductor substrate after forming said gate formation step;

wherein said step (a) further comprises the steps of:

forming a first insulator on a principal plane of said semiconductor substrate;

forming an opening by removing a formation region for said trench from said first insulator; and forming said trench by removing a semiconductor substrate exposed from said opening by using said first insulator as a mask; and wherein said step (b) further comprises the steps of:

forming a second insulator on an inner face of said trench;

forming an oxidation-resistant third insulator on a surface of said second insulator;

leaving said third insulator on a side face of said trench by etching back said third insulator;

selectively forming a thick insulator on a region exposed from said third insulator on said semiconductor substrate by applying oxidation treatment to said semiconductor substrate;

removing said third insulator and then removing said second insulator; and forming a gate insulator so that a semiconductor substrate's principal plane portion exposed from said first insulator's opening and said trench bottom become thicker than a trench side face by applying oxidation treatment to said semiconductor substrate after said step of removing said second insulator and after making said first insulator's opening larger than said trench, and said step (c) further comprises the steps of:

depositing a conductor film in said trench and on said semiconductor substrate's principal plane; and forming said gate with a T-shaped cross section by etching back said conductor film.

4. The manufacturing method of semiconductor device according to claim 3, further comprising the step of depositing an insulator on a surface of said gate insulator by means of chemical vapor growth after said step of forming a gate insulator.

5. A manufacturing method of semiconductor device, comprising the steps of:

(a) forming a trench in a semiconductor substrate;

(b) forming a gate insulator in said trench so that a trench bottom becomes thicker than a trench side face;

(c) forming a gate in said trench after forming said gate insulator;

(d) implanting impurities for forming a channel region in said semiconductor substrate after forming said gate formation step; and (e) implanting impurities for forming a source region in said semiconductor substrate after forming said gate formation step;

wherein said step (b) further comprises the steps of:

forming a second insulator on an inner face of said trench;

forming an oxidation-resistant third insulator on a surface of said second insulator;

leaving said third insulator on a side face of said trench by etching back said third insulator;

selectively forming a thick insulator on a region exposed from a third insulator on said semiconductor substrate by applying oxidation treatment to said semiconductor substrate;

removing said third insulator and then removing said second insulator; and forming said gate insulator by applying oxidation treatment to said semiconductor substrate after said step of forming a gate insulator.

6. The manufacturing method of semiconductor device according to claim 5, further comprising the step of depositing an insulator on a surface of said gate insulator by means of chemical vapor growth after said step of forming a gate insulator.

7. The manufacturing method of semiconductor device according to claim 5, wherein said step (c) further comprises the steps of:

depositing a conductor film in said trench and on said semiconductor substrate's principal plane; and forming said gate with an I-shaped cross section by etching back said conductor film.

8. The manufacturing method of semiconductor device according to claim 5, wherein said step (c) further comprises the steps of:

depositing a conductor film in said trench and on said semiconductor substrate's principal plane, said conductor film having an impurity density higher than an impurity density of said semiconductor substrate;

forming said I-shaped gate by etching back said conductor film;

forming a cap insulator on a top surface of said I-shaped gate by applying oxidation treatment to said semiconductor substrate; and using said cap insulator as a mask and removing a semiconductor substrate's principal plane portion exposed therefrom for a specified depth to protrude said gate's top surface from a semiconductor substrate's principal plane.

9. The manufacturing method of semiconductor device according to claim 5, wherein said step (c) further comprises the steps of:

depositing a conductor film in said trench and on said semiconductor substrate's principal plane, said conductor film having an impurity density higher than an impurity density of said semiconductor substrate;

forming said I-shaped gate by etching back said conductor film;

forming a cap insulator on a top surface of said I-shaped gate by applying oxidation treatment to said semiconductor substrate; and forming a mask pattern to cover said cap insulator on said semiconductor substrate's principal plane, using said mask pattern as a mask, and removing a semiconductor substrate's principal plane portion exposed therefrom for a specified depth to protrude said gate's top surface from a semiconductor substrate's principal plane.

10. A manufacturing method of semiconductor device, comprising the steps of:

(a) forming a trench in a semiconductor substrate;

(b) forming a gate insulator in said trench so that a trench bottom becomes thicker than a trench side face;

(c) forming a gate in said trench after forming said gate insulator;

(d) implanting impurities for forming a channel region in said semiconductor substrate after forming said gate formation step; and (e) implanting impurities for forming a source region in said semiconductor substrate after forming said gate formation step;

wherein said method further comprises the steps of:

forming a field-effect transistor having said gate on said semiconductor substrate and then depositing an inter-layer insulator on said semiconductor substrate's principal plane;

boring a first hole for exposing said channel region in said inter-layer insulator and semiconductor substrate;

implanting same conductive impurities as those constituting said channel region thereinto through said first hole so that impurities to be implanted become relatively denser than those constituting said channel region;

letting said inter-layer insulator involve said hole according to a plane view and forming a larger second hole than said hole so as to expose a source region on said semiconductor substrate's principal plane; and depositing a conductor film so as to be embedded in said first and second holes and forming wiring by patterning.

* * * * *